(12) United States Patent
Hanser et al.

(10) Patent No.: US 7,727,874 B2
(45) Date of Patent: Jun. 1, 2010

(54) NON-POLAR AND SEMI-POLAR GAN SUBSTRATES, DEVICES, AND METHODS FOR MAKING THEM

(75) Inventors: Andrew David Hanser, Raleigh, NC (US); Edward Alfred Preble, Raleigh, NC (US); Lianghong Liu, Raleigh, NC (US); Terry Lee Clites, Raleigh, NC (US); Keith Richard Evans, Raleigh, NC (US)

(73) Assignee: Kyma Technologies, Inc., Raleigh, NC (US)

( * ) Notice: Subject to any disclaimer, the term of this patent is extended or adjusted under 35 U.S.C. 154(b) by 0 days.

(21) Appl. No.: 12/283,533

(22) Filed: Sep. 12, 2008

(65) Prior Publication Data

US 2009/0081857 A1    Mar. 26, 2009

Related U.S. Application Data

(60) Provisional application No. 60/993,867, filed on Sep. 14, 2007.

(51) Int. Cl.
*H01L 21/28* (2006.01)
*H01L 21/3205* (2006.01)

(52) U.S. Cl. ............. 438/604; 438/99; 438/197; 257/E21.17; 257/E21.051; 257/E21.108; 257/E21.304; 257/E21.327; 257/E21.563; 257/E21.701

(58) Field of Classification Search ........... 438/99, 438/197, 602, 603, 604, 680, 692, 729, 746, 438/931; 257/E21.17, 51, 108, 304, 327, 257/562, 701
See application file for complete search history.

(56) References Cited

U.S. PATENT DOCUMENTS

| | | | | |
|---|---|---|---|---|
| 6,274,518 | B1 * | 8/2001 | Yuri et al. | 438/791 |
| 6,398,867 | B1 * | 6/2002 | D'Evelyn et al. | 117/11 |
| 6,413,627 | B1 * | 7/2002 | Motoki et al. | 428/332 |
| 6,440,823 | B1 * | 8/2002 | Vaudo et al. | 438/478 |
| 6,693,021 | B1 * | 2/2004 | Motoki et al. | 438/481 |
| 6,750,121 | B1 * | 6/2004 | Kim | 438/488 |

(Continued)

FOREIGN PATENT DOCUMENTS

WO    WO 2007/084783 A2    7/2007

(Continued)

OTHER PUBLICATIONS

Grzegory et al., "Recent Results in the Crystal Growth of GaN at High N2 Pressure", *MRS Internet Journal of Nitride Semiconductor Research*, vol. 1, Article 20, 19 pgs (1996).

(Continued)

*Primary Examiner*—David Nhu
(74) *Attorney, Agent, or Firm*—Goodwin Procter LLP

(57) ABSTRACT

Non-polar or semi-polar (Al, Ga, In)N substrates are fabricated by re-growth of (Al, Ga, In)N crystal on (Al, Ga, In)N seed crystals, wherein the size of the seed crystal expands or is increased in the lateral and vertical directions, resulting in larger sizes of non-polar and semi-polar substrates useful for optoelectronic and microelectronic devices. One or more non-polar or semi-polar substrates may be sliced from the re-grown crystal. The lateral growth rate may be greater than the vertical growth rate. The seed crystal may be a non-polar seed crystal. The seed crystal may have crystalline edges of equivalent crystallographic orientation.

33 Claims, 8 Drawing Sheets

U.S. PATENT DOCUMENTS

| | | | |
|---|---|---|---|
| 7,097,707 B2 * | 8/2006 | Xu | 117/13 |
| 2007/0138505 A1 | 6/2007 | Preble et al. | 257/190 |
| 2007/0141823 A1 | 6/2007 | Preble et al. | 438/604 |

FOREIGN PATENT DOCUMENTS

| | | | |
|---|---|---|---|
| WO | WO 2008/048303 A2 | 4/2008 | |

OTHER PUBLICATIONS

Ho et al., "Solid phase immiscibility in GaInN", *Appl. Phys. Lett.*, 69 (18), pp. 2701-2703 (Oct. 28, 1996).

Nakamura et al., "InGaN-Based Multi-Quantum-Well-Structure Laser Diodes", *Jpn. J. Appl. Phys.*, vol. 35, pp. L74-L76 (1996).

Kapolnek et al., "Anisotropic epitaxial lateral growth in GaN selective area epitaxy", *Appl. Phys. Lett.*, 71 (9), pp. 1204-1206 (Sep. 1, 1997).

Takeuchi et al., "Quantum-Confined Stark Effect due to Piezoelectric Fields in GaInN Strained Quantum Wells", *Jpn. J. Appl. Phys.*, vol. 36, pp. L382-L385 (1997).

Zheleva et al., "Dislocation density reduction via lateral epitaxy in selectively grown GaN structures", *Appl. Phys. Lett.* 71 (17), pp. 2472-2474 (Oct. 27, 1997).

Jahnen et al., "Pinholes, Dislocations and Strain Relaxation in InGaN", MRS Internet Journal Nitride Semiconductor Research, 3, 39, pp. 1-10 (1998).

Bernardini et al., "Spontaneous versus Piezoelectric Polarization in III-V Nitrides—Conceptual Aspects and Practical Consequences", *Phys. Stat. Sol.* (b) 216, pp. 391-398 (1999).

Northrup et al., "Indium-induced changes in GaN(0001) surface morphology", *Physical Review B*, vol. 60, No. 12, pp. R8473-R8476 (Sep. 15, 1999).

Park et al., "Crystal-orientation effects on the piezoelectric field and electronic properties of strained wurtzite semiconductors", *Physical Review B*, vol. 59, No. 7, pp. 4725-4737 (Feb. 15, 1999).

Waltereit et al., "Nitride semiconductors free of electrostatic fields for efficient white light-emitting diodes", *Nature*, vol. 406, pp. 865-868 (Aug. 24, 2000).

Hiramatsu, "Epitaxial lateral overgrowth techniques used in group III nitride epitaxy", *J. Phys: Condens. Matter*, 13, pp. 6961-6975 (2001).

Mathis et al., "Modeling of threading dislocation reduction in growing GaN layers", *Journal of Crystal Growth*, 231, pp. 371-390 (2001).

Craven et al., "Structural characterization of nonpolar (1120) a-plane GaN thin films grown on (1102) r-plane sapphire", *Applied Physics Letters*, vol. 81, No. 3, pp. 469-471 (Jul. 15, 2002).

Hsu et al., "Direct imaging of reverse-bias leakage through pure screw dislocations in GaN films grown by molecular beam epitaxy on GaN templates", *Applied Physics Letters*, vol. 81, No. 1, pp. 79-81 (Jul. 1, 2002).

Karpov et al., "Dislocation effect on light emission efficiency in gallium nitride", *Applied Physics Letters*, vol. 81, No. 25, pp. 4721-4723 (Dec. 16, 2002).

Ng, "Molecular-beam epitaxy of GaN/$Al_xGa_{1-x}N$ multiple quantum wells on R-plane (1012) sapphire substrates", *Applied Physics Letters*, vol. 80, No. 23, pp. 4369-4371 (Jun. 10, 2002).

Cho et al., "Carrier loss and luminescence degradation in green-light-emitting InGaN quantum wells with micron-scale indium clusters", *Applied Physics Letters*, vol. 83, No. 13, pp. 2578-2580 (Sep. 29, 2003).

Craven et al., "Characterization of a-Plane GaN/(Al,Ga)N Multiple quantum Wells Grown via Metalorganic Chemical Vapor Deposition", *Jpn. J. Appl. Phys.*, vol. 42, pp. L235-L238 (2003).

Hanser et al., "Growth and Fabrication of 2 inch Free-standing GaN Substrates via the Boule Growth Method", *Mat. Res. Soc. Symp. Proc.*, vol. 798, pp. Y2.1.1-Y2.1.6 (2003).

Haskell et al., "Structural and morphological characteristics of planar (1120) a-plane gallium nitride grown by hydride vapor phase epitaxy", *Applied Physics Letters*, vol. 83, No. 8, pp. 1554-1556 (Aug. 25, 2003).

Haskell et al., "Defect reduction in (1120) a-plane gallium nitride via lateral epitaxial overgrowth by hydride vapor-phase epitaxy", *Applied Physics Letters*, vol. 83, No. 4, pp. 644-646 (Jul. 28, 2003).

Simpkins et al., "Correlated scanning Kelvin probe and conductive atomic force microscopy studies of dislocations in gallium nitride", *Journal of Applied Physics*, vol. 94, No. 3, pp. 1448-1453 (Aug. 1, 2003).

Wu et al., "Polarity determination of a-plane GaN on r-plane sapphire and its effects on lateral overgrowth and heteroepitaxy", *Journal of Applied Physics*, vol. 94, No. 2, pp. 942-947 (Jul. 15, 2003).

Chakraborty et al., "Nonpolar InGaN-GaN emitters on reduced-defect lateral epitaxially overgrown a-plane GaN with drive-current-independent electroluminescence emission peak", *Applied Physics Letters*, vol. 85, No. 22, pp. 5143-5145 (Nov. 29, 2004).

Chen et al., "Study on the stability of the high-brightness white LED", *Phys. Stat. Sol.* (b), 241, No. 12, pp. 2664-2667 (2004).

Ito et al., "AlGaInN Violet Laser Diodes Grown on GaN Substrates with Low Aspect Ratio", *Japanese Journal of Applied Physics*, vol. 43, No. 1, pp. 96-99 (2004).

Katz et al., "Persistent photocurrent and surface trapping in GaN Schottky ultraviolet detectors", *Applied Physics Letters*, vol. 84, No. 20, pp. 4092-4094 (May 17, 2004).

Nakamura et al., "Ultrahigh-quality silicon carbide single crystals", *Nature*, vol. 430, pp. 1009-1012 (Aug. 26, 2004).

Paskova et al., "Polar and nonpolar GaN grown by HVPE: Preferable substrates for nitride-based emitting devices", *Phys. Stat. Sol.* (a), 201, No. 10, pp. 2265-2270 (2004).

Porowski et al., "Blue lasers on high pressure grown GaN single crystal substrates", *Europhysics News*, vol. 35, No. 3, pp. 69-73 (May/Jun. 2004).

Wang et al., "Anisotropic structural characteristics of (1120) GaN templates and coalesced epitaxial lateral overgrown films deposited on (1012) sapphire", *Applied Physics Letters*, vol. 84, No. 4, pp. 499-501 (Jan. 26, 2004).

Wetzel et al., "Analysis of the wavelength-power performance roll-off in green light emitting diodes", *Phys. Stat. Sol.* (c), 1, No. 10, pp. 2421-2424 (2004).

Katz et al., "Characteristics of $InAl_{1-x}N$—GaN High-Electron Mobility Field-Effect Transistor", *IEEE Transactions on Electron Devices*, vol. 52, No. 2, pp. 146-150 (Feb. 2005).

Chakraborty et al., "Demonstration of Nonpolar m-Plane InGaN/GaN Light-Emitting Diodes on Free-Standing m-Plane GaN Substrates", *Japanese Journal of Applied Physics*, vol. 44, No. 5, pp. L173-L175 (2005).

Haskell et al., "Microstructure and Enhanced Morphology of Planar Nonpolar m-Plane GaN Grown by Hydride Vapor Phase Epitaxy", *Journal of Electronic Materials*, vol. 34, No. 4, pp. 357-360 (2005).

Haskell et al., "Defect reduction in (1100) m-plane gallium nitride via lateral epitaxial overgrowth by hydride vapor phase epitaxy", *Applied Physics Letters*, 86, pp. 111917-1 to 111917-3 (2005).

Paskova et al., "Properties of nonpolar a-plane GaN films grown by HVPE with AlN buffers", *Journal of Crystal Growth*, 281, pp. 55-61 (2005).

Teisseyre et al., "Free and bound excitons in GaN/AlGaN homoepitaxial quantum wells grown on bulk GaN substrate along with nonpolar (1120) direction", *Applied Physics Letters*, 86, pp. 162112-1 to 162112-3 (2005).

Zakharov et al., "Transmission Electron Microscopy Study of Nonpolar a-Plane GaN Grown by Pendeo-Epitaxy on (1120) 4H-SiC", *Mater. Res. Soc. Symp. Proc*, vol. 864, pp. E4.14.1 to E4.14.6 (2005).

Zakharov et al., "Structural TEM study of nonpolar a-plane gallium nitride grown on (1120) 4H-SiC by organometallic vapor phase epitaxy", *Physical Review B*, 71, pp. 235334-1 to 235334-9 (2005).

Funato et al., "Blue, Green and Amber InGaN/GaN Light-Emitting Diodes on Semipolar (1122) GaN Bulk Substrates", *Japanese Journal of Applied Physics*, vol. 45, No. 26, pp. L659-L662 (2006).

Imer et al., "Improved quality (1120) a-plane GaN with sidewall lateral epitaxial overgrowth", *Applied Physics Letters*, 88, pp. 061908-1 to 061908-3 (2006).

Limb et al., "GaN ultraviolet avalanche photodiodes with optical gain greater than 1000 grown on GaN substrates by metal-organic chemical vapor deposition", *Applied Physics Letters*, 89, pp. 011112-1 to 011112-3 (2006).

Lucznik et al., "Crystallization of Bulk GaN by HVPE on Pressure Grown Needle Shaped Seeds", *Tu3-2,* IWN2006, Kyoto, Japan, 1 pg. (Oct. 2006).

Mion et al., "Accurate dependence of gallium nitride thermal conductivity on dislocation density", *Applied Physics Letters,* 89, pp. 092123-1 to 092123-3 (2006).

Okamoto et al., "Dislocation-Free *m*-Plane InGaN/GaN Light-Emitting Diodes on *m*-Plane GaN Single Crystals", *Japanese Journal of Applied Physics,* vol. 45, No. 45, pp. L1197-L1199 (2006).

Nam et al., "AlInGaN-Based Laser Diodes in Blue and Green wavelength", *Mol-5,* IWN2006, Kyoto, Japan, p. 70 (Oct. 2006).

Paskova et al., "High-quality bulk *a*-plane GaN sliced from boules in comparison to heteroepitaxially grown thick films on *r*-plane sapphire", *Applied Physics Letters,* 89, pp. 051914-1 to 051914-3 (2006).

Paskova et al., "Nonpolar *a*- and *m*-plane Bulk GaN Sliced from Boules: Structural and Optical Characteristics", *MoP1-55,* IWN2006, Kyoto, Japan, p. 235 (Oct. 2006).

Tachibana et al., "Extremely smooth surface morphology of GaN-based layers on misoriented GaN substrates for high-power blue-violet lasers", *Phys. Stat. Sol. (c)*, 3, No. 6, pp. 1819-1822 (2006).

Feezell et al., "AlGaN-Cladding-Free Nonpolar InGaN/GaN Laser Diodes", *Japanese Journal of Applied Physics,* vol. 46, No. 13, pp. L284-L286 (2007).

Hanser et al., "Surface preparation of substrates from bulk GaN crystals", *Journal of Crystal Growth,* 305, pp. 372-376 (2007).

Kim et al., "Improved electroluminescense on nonpolar *m*-plane InGaN/GaN quantum wells LEDs", *Phys. Stat. Sol. (RRL)*, 1, No. 3, pp. 125-127 (2007).

Okamoto et al., "Continuous-Wave Operation of *m*-Plane InGaN Multiple Quantum Well Laser Diodes", *Japanese Journal of Applied Physics,* vol. 46, No. 9, pp. L187-L189 (2007).

Schmidt et al., "Demonstration of Nonpolar *m*-Plane InGaN/GaN Laser Diodes", *Japanese Journal of Applied Physics,* vol. 46, No. 9, pp. L190-L191 (2007).

Motoki et al., "Dislocation reduction in GaN crystal by advanced-DEEP", *Journal of Crystal Growth,* 305, pp. 377-383 (2007).

Coltrin et al., "Gallium Nitride Crystal Growth Kinetics from Selective-Area Growth Experiments and 3-D Morphology Evolution Model", *Wide Bandgap Compound Semiconductor Science,* pp. 16-17.

Rohm Realizes the world first Continuous-wave Operation of a Nonpolar (m-plane) Blue-violet Laser Diode at Room Temperature, thus Moving a Step Closer to the Realization of a Green Laser Diode, 1 pg. (2007), as printed from http://www.rohm.com/news/070201.html on Mar. 3, 2009.

U.S. Appl. No. 11/606,783, filed Nov. 30, 2006, Titled "Single Crystal Group III Nitride Articles and Method of Producing Same by HVPE Method Incorporating a Polycrystalline Layer for Yield Enhancement".

International Search Report and Written Opinion From Corresponding PCT Application No. PCT/US2008/010638, Dec. 22, 2008 (8 pgs).

* cited by examiner

NON-POLAR AND SEMI-POLAR GAN SUBSTRATES, DEVICES, AND METHODS FOR MAKING THEM

CROSS-REFERENCE TO RELATED APPLICATIONS

This application claims the benefit of U.S. Provisional Patent Application Ser. No. 60/993,867, filed Sep. 14, 2007, titled "Large-area, Non-polar and Semi-polar GaN Substrates, Devices, and Articles, and Methods for Making Them," the content of which is incorporated by reference herein in its entirety.

FEDERALLY SPONSORED RESEARCH

This invention was made with government support under grant number W911NF-06-C-0154 by the U.S. Army. The United States Government may have certain rights in the invention.

BACKGROUND OF THE INVENTION

1. Field of the Invention

This invention relates to large-area, non-polar and semi-polar gallium nitride (Al, Ga, In)N substrates useful for producing optoelectronic devices (such as light emitting diodes (LEDs), laser diodes (LDs) and photodetectors) and electronic devices (such as diodes and field effect transistors (FETs)) composed of III-V nitride compounds, and to methods for producing such articles.

2. Description of the Related Art

Group III-V nitride compounds such as aluminum nitride (AlN), gallium nitride (GaN), indium nitride (InN), and alloys such as AlGaN, InGaN, and AlGaInN, are direct bandgap semiconductors with bandgap energy ranging from about 0.6 eV for InN to about 6.2 eV for AlN. These materials may be used to produce light emitting devices such as LEDs and LDs of short wavelength in the green, blue and ultraviolet (UV) spectra, as well as high-frequency, high power RF devices, and device power electronics, such as diodes and field effect transistors (FETs).

GaN-based semiconductor materials and devices have historically been developed through crystal growth in the [0001] direction (c-plane). The lack of mirror-like (or two-fold) symmetry of the hexagonal crystal structure gives rise to spontaneous polarization in the [0001] direction. Additionally, strain in lattice mismatched hetero-epitaxially grown device layers result in piezoelectric polarization. These polarization effects result in large built-in electric fields, hampering the performance of nitride-based devices. In optical devices, the built in polarization field results in charge separation within quantum wells and decreases the recombination efficiency of electron-hole pairs and red-shifts the emission wavelengths. For microelectronic devices, the spontaneous and piezoelectric polarization allows for the accumulation of a very high density of sheet charge ($n_d$) in the conducting channel of GaN-based HEMTs; however the surface of the device requires the appropriate passivation and is sensitive to the stress induced by passivation and thermal effects. As a result, researchers have investigated methods to eliminate the built-in fields of devices grown in the [0001] direction.

Recently, attention has been paid to the development of nitride epitaxial layers and heterostructures with non-polar and semi-polar crystal orientations. GaN-based quantum structures grown along non-polar directions, such as the [1100] (resulting in m-plane surfaces) and [1120] (resulting in a-plane surfaces) have been shown to be free of the aforementioned polarization effects. Additionally, certain orientations of the GaN crystal structure, in particular the [1101] and [1122] have been identified as orientations with low spontaneous polarization relative to the [0001] direction, and have been labeled as semi-polar orientations. Using heteroepitaxially grown non-polar and semi-polar thin films and devices fabricated thereon, higher internal quantum efficiencies and lower EL peak sensitivity for LEDs have been demonstrated. Initial results in this emerging technological area show great promise for non-polar and semi-polar substrates in impacting a number of commercial applications, such as laser diodes, visible and UV LEDs, and high power electronic devices. One of the current limitations in developing non-polar and semi-polar GaN-based devices is the availability of high-quality, large area substrates, which is due to limitations in crystal growth technology.

In order to achieve large area, low defect density non-polar substrates, different growth techniques, substrate materials, and layer orientations have been investigated. The majority of these approaches involve the heteroepitaxial growth of non-polar GaN on non-native (non-GaN or other nitride) substrates. The published research studies are consistent that, in addition to the well known problems for heteroepitaxially grown nitrides in the [0001] direction on sapphire and SiC, such as high dislocation density and strain induced effects, the material grown in [1120] direction on both (1102)-plane (r-plane) sapphire and (1120)-plane (a-plane) SiC, the non-polar GaN material includes a high density of stacking fault (SF) defects and in-plane anisotropy of all the materials properties. Lower mismatch substrates such as spinel ($MgAl_2O_4$) and lithium aluminum oxide ($LiAlO_2$) have been suggested with the hope of enabling lower defect density, yet similar structural and impurity related problems have been observed. The well known approach for epitaxial lateral overgrowth (ELOG), employing a selective-growth stripe pattern, has also been used and has been found to improve the morphology and to reduce significantly the defect density, but still the optical properties have been defect dominated. Practically speaking, the ELOG approach has a number of implementation difficulties, including film cracking, anisotropic growth modes in different crystalline directions, stress and crystalline tilt across wing regions and uniformity of coalescence across large areas. Bearing these challenges in mind, an approach to fabricating GaN crystals with selected non-polar crystal orientations of large size and low defect density is desired.

We have investigated and developed the hydride vapor phase epitaxy (HVPE) growth technique for fabricating non-polar GaN substrates. In one example, HVPE layers grown on sapphire in the [0001] direction were grown to ~1 cm and sliced into non-polar, freestanding bulk GaN substrates. The materials properties of these substrates were extensively characterized using a variety of techniques, and were compared to non-polar and semi-polar GaN layers and substrates grown on non-native substrates. This approach has several advantages over the direct growth of non-polar GaN material. First, the resulting GaN crystal enables one to select the desired non-polar or semi-polar orientation, enabling on-demand crystal orientation for the substrate. Second, preliminary characterization results show the material uniformity and the defect density are significantly improved over heteroepitaxially grown material. The success of this approach depends on the ability to grow thick HVPE layers in the [0001] direction and this capability has been demonstrated for fabrication of [0001] substrates for optoelectronic and microelectronic applications. Increasing the size of non-polar and semi-polar substrates using this technique requires extended growth in the [0001] direction, i.e. 2 inches or more for 2 inch diameter non-polar substrates. According to the present teachings as described below, an alternative method to providing large area, low defect density non-polar and semi-polar substrates is to use a native (i.e. GaN) seed crystal for further growth of bulk GaN material and to then expand the size of the seed crystal laterally to obtain larger substrates.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a method is provided for making a non-polar GaN substrate. A non-polar GaN seed crystal is provided. The non-polar GaN seed crystal includes a top surface lying in a first non-polar plane, and one or more side walls adjoining the top surface, wherein the GaN seed crystal has a vertical dimension bounded by the top surface and the bottom surface, and a lateral dimension bounded by the one or more side walls and orthogonal to the vertical dimension. A vertical re-growth region is grown from the top surface and a lateral re-growth region is grown from the one or more side walls to form a re-grown GaN crystal, by growing GaN on the GaN seed crystal utilizing a vapor phase growth process. The re-grown GaN crystal has a vertical dimension greater than the vertical dimension of the GaN seed crystal and a lateral dimension greater than the lateral dimension of the GaN seed crystal. The re-grown GaN crystal is sliced along a second non-polar plane to form a non-polar GaN substrate The non-polar GaN substrate has a lateral dimension along the second non-polar plane, and the lateral dimension of the non-polar GaN substrate is greater than the lateral dimension of the GaN seed crystal.

According to another implementation, a method is provided for making a re-grown GaN crystal is provided. A GaN seed crystal is provided. The GaN seed crystal includes a top surface and a plurality of crystalline edges of equivalent crystallographic direction adjoining the top surface, wherein the GaN seed crystal has a vertical dimension bounded by the top surface, and a lateral dimension bounded by an opposing pair of the crystalline edges and orthogonal to the vertical dimension. A lateral re-growth region is grown a from each of the crystalline edges to form a re-grown GaN crystal, by growing GaN on the GaN seed crystal utilizing a vapor phase growth process. The re-grown GaN crystal has a lateral dimension inclusive of the lateral re-growth regions grown from the opposing pair of crystalline edges, and the lateral dimension of the re-grown GaN crystal is greater than the lateral dimension of the GaN seed crystal.

According to another implementation, a method is provided for making a re-grown GaN crystal is provided. A non-polar GaN seed crystal is provided. The non-polar GaN seed crystal includes a top surface lying in a non-polar plane, and one or more side walls adjoining the top surface, wherein the GaN seed crystal has a vertical dimension bounded by the top surface, and a lateral dimension bounded by the one or more side walls and orthogonal to the vertical dimension. A vertical re-growth region is grown from the top surface and a lateral re-growth region is grown from the one or more side walls to form a re-grown GaN crystal, by growing GaN on the GaN seed crystal utilizing a vapor phase growth process. The growth rate in the lateral re-growth region is greater than the growth rate in the vertical re-growth region.

According to another implementation, a method is provided for making a re-grown GaN crystal is provided. A GaN seed crystal is provided. The GaN seed crystal includes a top surface and a plurality of crystalline edges of equivalent crystallographic direction adjoining the top surface, wherein the GaN seed crystal has a vertical dimension bounded by the top surface and the bottom surface, and a lateral dimension bounded by an opposing pair of the crystalline edges and orthogonal to the vertical dimension. A vertical re-growth region is grown from the top surface and a lateral re-growth region is grown from each of the crystalline edges to form a re-grown GaN crystal, by growing GaN on the GaN seed crystal utilizing a vapor phase growth process. The growth rate in the lateral re-growth regions is greater than the growth rate in the vertical re-growth region.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following FIGURES. The components in the figures are not necessarily to scale, emphasis instead being placed upon illustrating the principles of the invention. In the figures, like reference numerals designate corresponding parts throughout the different views.

DETAILED DESCRIPTION OF THE PREFERRED EMBODIMENTS

Figure 1B:
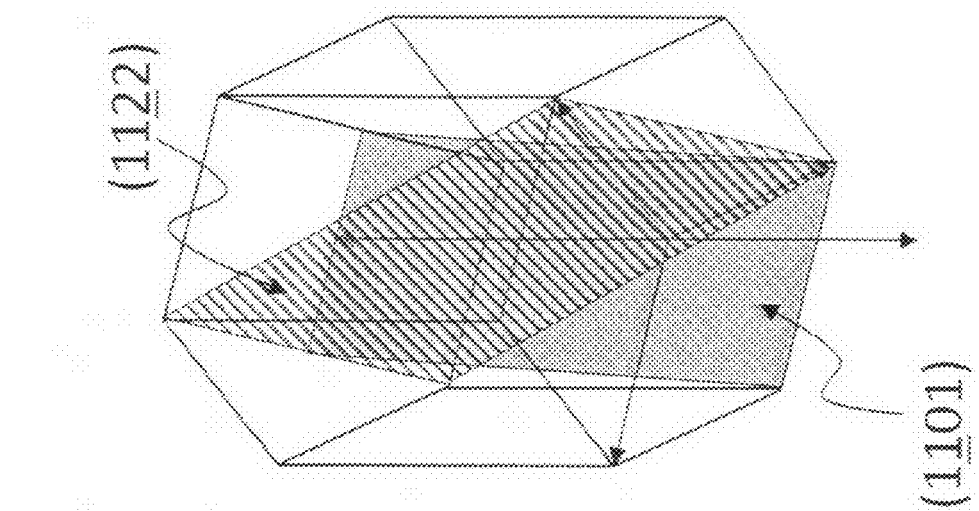
FIG. 1B is a schematic representation of the (1101) and (1122) semi-polar crystal planes in the GaN hexagonal crystal structure illustrated in FIG. 1A.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

Unless otherwise indicated, terms such as "gallium nitride" and "GaN" are intended to describe binary, ternary, and quaternary Group III nitride-based compounds such as, for example, gallium nitride, indium nitride, aluminum nitride, aluminum gallium nitride, indium gallium nitride, indium aluminum nitride, and aluminum indium gallium nitride, and alloys, mixtures, or combinations of the foregoing, with or without added dopants, impurities or trace components, as well as all possible crystalline structures and morphologies, and any derivatives or modified compositions of the foregoing. Unless otherwise indicated, no limitation is placed on the stoichiometries of these compounds. Thus, the term "GaN" encompasses Group III nitrides and nitride alloys; that is, $Al_xGa_yIn_zN$ (x+y+z=1, $0 \leq x \leq 1$, $0 \leq y \leq 1$, $0 \leq z \leq 1$), or (Al, Ga, In)N.

For purposes of the present disclosure, it will be understood that when a crystal or substrate orientation is referred to as having a "non-polar" orientation, except where explicitly stated otherwise this will also include the semi-polar orientations.

Referring to the drawings in general, it will be understood that the illustrations are for the purpose of describing examples of embodiments or implementations of the invention and are not intended to limit the invention thereto.

In certain implementations of the invention, a method is provided for making a nitride-based compound semiconductor substrate using a GaN seed crystal (i.e., (Al, Ga, In)N as defined herein) and a vapor phase growth process whereby, upon re-growth on the seed crystal, the size of the GaN seed crystal is increased in the lateral and vertical directions resulting in larger sizes of non-polar and semi-polar substrates useful for optoelectronic and microelectronic devices. As described below for certain implementations, the GaN seed crystal may be a non-polar seed crystal, and/or may have crystalline edges of equivalent crystallographic orientation.

According to one aspect of the invention, non-polar seed crystals are provided. In a vapor phase growth process such as, for example, HVPE, thick GaN boules are grown on AlN nucleation layers on sapphire substrates. Following fabrication of the boules, they are prepared for slicing along the c-axis to create a-plane substrates and/or m-plane substrates. The GaN crystalline directions in the boule may be identified via X-ray diffraction or other suitable technique prior to slicing on a fixed-abrasive multi-wire saw or other suitable slicing means. The boules are sliced parallel to a preferred direction in order to produce either a- or m-plane substrates. Following the slicing of the non-polar substrates, the substrates were processed to prepare an epi-ready growth surface. After lapping for flatness and to establish the final wafer thickness the substrates were polished by a suitable technique such as by, for example, using a mechanical polish followed by a chemical-mechanical polish (CMP) step. As non-limiting examples, the dimensions of the final substrates may range from 3 to 7 mm in the [0001] direction, 10 to 20 mm in the [1100] or [1120] direction (the orientation depending on whether the substrates are a-plane or m-plane), and 300 to 500 μm thick in the [1120] or [1100] directions (the orientation again depending on whether the substrates are a-plane or m-plane). In another example, the area of the top surface of the substrate may be approximately 25 mm$^2$ or greater.

In one aspect of the present invention, the non-polar GaN substrates mentioned above may be used as planar seeds for re-growth of GaN crystals via a vapor phase process. In one example, the vapor phase growth method utilized was the HVPE process, which enables high growth rates, high purity crystal growth, and control of the electrical properties. Other vapor phase growth processes may also be suitable and thus are encompassed by the present teachings. The non-polar planar seed crystals can be prepared for re-growth using the aforementioned process and by cleaning the samples using a standard solvent cleaning process. By means of the HVPE process, re-growth on the non-polar seed generates a layer on top of the seed, and under optimized conditions, expands the size of the seed through lateral growth on the sidewalls of the seed. Under optimized growth conditions, the lateral growth rate of the vapor phase growth can be higher than that of the vertical growth direction. As one non-limiting example, the lateral growth rate may be approximately 400 μm/hr or greater while the vertical growth rate is approximately 250 μm/hr or greater. In another example, the ratio of lateral growth rate to vertical growth rate may be about 1.6:1 or greater. In another example, the amount of lateral re-growth from one side of the starting seed crystal may be approximately 800 μm or greater, while the amount of vertical re-growth from the top surface of the starting seed crystal may be approximately 500 μm or greater. When the GaN crystal is processed into a substrate following growth using standard slicing, lapping, and polishing processes, the size of the substrate resulting from the vapor phase re-growth is larger than the starting seed. This substrate can also be used as a seed for further growth and can be used to further increase the size of the non-polar substrate.

According to the present invention, a high quality re-growth layer can be obtained due to the high quality of the seed prepared using the HVPE growth method and by optimizing the vapor phase growth conditions. This results from the low dislocation density in the seed, the low degree of crystal tilt as measured by X-ray diffraction, and the high quality of the surface of the seed. Optimizing the growth conditions, such as the growth initiation, the impurity concentrations in the regrown layer, and the growth rate, will maintain and replicate the high quality and excellent uniformity of the seed in the re-growth layer. As a result of the re-growth process, the dislocation density in the regrown crystal may be approximately the same as or even lower than the dislocation density in the seed crystal.

One aspect of the present invention concerns using a non-polar GaN seed crystal and a vapor phase growth process whereby, upon re-growth on the seed crystal, the size of the GaN crystal is increased in the lateral and vertical directions. For example, for an m-plane seed crystal the lateral growth can occur in the <1120> direction or in the <0001> direction and the vertical growth occurs in the <1100> direction, in accord with the structure of the GaN hexagonal crystal. In comparison to other approaches, the approach of the present invention differs in several regards and yields novel and unexpected results.

One issue present with the growth on non-polar seed crystals is the reduced in-plane crystal symmetry. For example, m-plane seed crystals prepared according to one aspect of the present invention have {0001} and {1120} edges. This may result in asymmetric seed expansion due to anisotropy in the crystal growth rates in different directions. For m-plane seed crystals, one can prepare the seed crystal with edges along the {1122} family of planes, providing edges of equivalent crystallographic direction. Under optimized growth conditions, vapor phase re-growth on seeds prepared with edges of equivalent crystallographic direction may result in symmetric seed expansion. Therefore, one aspect of the current invention concerns the preparation of non-polar seed crystals with edges of equivalent crystallographic direction and the optimized growth thereupon, enabling uniform seed expansion and the size of the GaN seed crystal is increased in the lateral and vertical directions.

Within the GaN-related field of research there are several examples where GaN-based crystalline layers are prepared and lateral and vertical growth is observed in the growth of the GaN layers. One widely applied method where lateral growth is observed in the growth of GaN-based crystalline layers is epitaxial lateral overgrowth (ELOG), with other related methods also known as lateral epitaxial overgrowth (LEO), pendeo-epitaxy, cantilever-epitaxy or selective area growth (SAG). In ELOG and similar methods, lithographic pattering and etching is required to generate either a surface patterned with a growth mask, or a patterned structure of GaN lines or columns. Heteroepitaxial growth of the GaN layer is initiated either on the surface patterned with a growth mask where windows are created in the mask, typically in an array of stripes or discrete circular or hexagonal openings, or on the lines or columns of the patterned structure. Growth of the GaN layer occurs in the windows of the growth mask or from the tops or sidewalls of the patterned structure and continues laterally to form a coalesced layer. Typically the layer is prepared using a vapor phase growth technique such as metalorganic chemical vapor deposition (MOCVD) or HVPE. This type of lateral growth is used over very small dimensions, with a typical pitch or period ranging from 3 to 10 μm, and is not used to increase the size of the substrate, but rather to control the dislocation density of the overgrown layer. Additionally, steps are required to form the patterned mask or structure prior to the growth of the ELOG layer. By contrast, the present invention has the unique and unexpected result of generating lateral growth from the edge of the non-polar GaN seed without the need of a growth mask or patterning, and can result in lateral growth on the order of 1,000 microns, as opposed to a few 10's of microns for the ELOG process.

Examples of other GaN crystal growth techniques where expansion of the GaN crystals can be observed are liquid phase growth techniques, such as high pressure solution growth, low pressure solution growth, and ammonothermal-type processes. The liquid phase and vapor phase growth processes are fundamentally different, possessing different transport and growth mechanisms and growth conditions. Liquid phase growth techniques involve solutions that are used to dissolve the growth feedstock and provide transport of the growth species for re-crystallization and growth on seed crystals. In high-pressure solution growth using a gallium melt as the solvent, nitrogen is dissolved at high pressures (~1 GPa) and temperatures (~1500° C.) to form crystals that are either thin hexagonal platelets or elongated hexagonal needles. In low-pressure solution growth, a solvent containing gallium and additional components that increase the solubility of nitrogen in the solution is used to dissolve nitrogen and transport it to seed crystals where GaN re-crystallizes and grows. These techniques are typically conducted at low to moderate pressures (~50 atm) and temperatures (~750° C.). In the ammonothermal growth process, supercritical ammonia is used as the solvent to dissolve and transport polycrystalline GaN to seed crystals where growth occurs through re-crystallization. In all of these processes, a solvent is used to dissolve and transport a growth species (either nitrogen or GaN) for growth. The driving force for growth from solution is a thermal gradient within the growth system and growth occurs through precipitation and re-crystallization due to a change in solubility resulting from the change in temperature. Additionally, the liquid phase is present in all of these processes and the liquid-solid interface plays an important role in the growth process.

In comparison to liquid-phase growth techniques, in vapor phase growth carried out in accordance with the present teachings, the source species are introduced as gaseous precursors and are transported in the vapor phase to the growth surface where the crystal growth occurs at a gas-solid interface. The driving force for crystal growth is not a thermal gradient and change of solubility, but rather the change in free energy when the precursors react to form the crystalline solid on the seed crystal. As a result, the present invention, which utilizes the vapor phase for crystal growth, differs in several fundamental aspects from growth from the liquid phase, and expansion of the seed crystal, which may occur as a result of both techniques, is controlled by different mechanisms and processes in the two approaches, resulting in a novel method for the vapor phase process, when compared to the liquid phase processes.

The vapor phase growth process has been used to demonstrate regrowth by two different methods in "Nonpolar GaN Quasi-Wafers Sliced from Bulk GaN Crystals Grown by High-Pressure Solution and HVPE Methods," (*Nitrides with Nonpolar Surfaces*, Ed. Tanya Paskova, Wiley-VCH, Weinheim, Germany, 2008). In the first instance, vapor phase growth has been demonstrated on c-plane high-pressure-grown platelets. Growth occurs on the c-plane of the seed crystal, which is then sliced to generate non-polar substrates. A limitation of this process is the growth is reported as non-uniform in terms of material quality and electron concentration. Additionally, while some seed expansion is observed, prismatic facets are observed on the re-growth, resulting in an inclined sidewall to the crystal and smaller lateral dimensions for substrates sliced from the crystal. In the second instance, vapor phase growth on c-plane oriented high-pressure-grown needles has been demonstrated, where growth occurs on the sidewalls of the needle in non-polar directions and the crystal is sliced to generate c-plane substrates. A limitation of this process is that the growth is reported as non-uniform in terms of material quality, where the initial seed crystal may include defects such as a void, or may differ significantly in electron concentration. Compared to the present invention, neither of these demonstrations starts with a non-polar seed crystal. Where non-polar re-growth is observed, it is on a needle-type seed-crystal as opposed to a planar, non-polar seed crystal. Finally, compared to the present invention, the demonstrations result in non-uniform material quality and electron concentration, whereas the present invention enables high quality and uniformity.

Figure 1A:
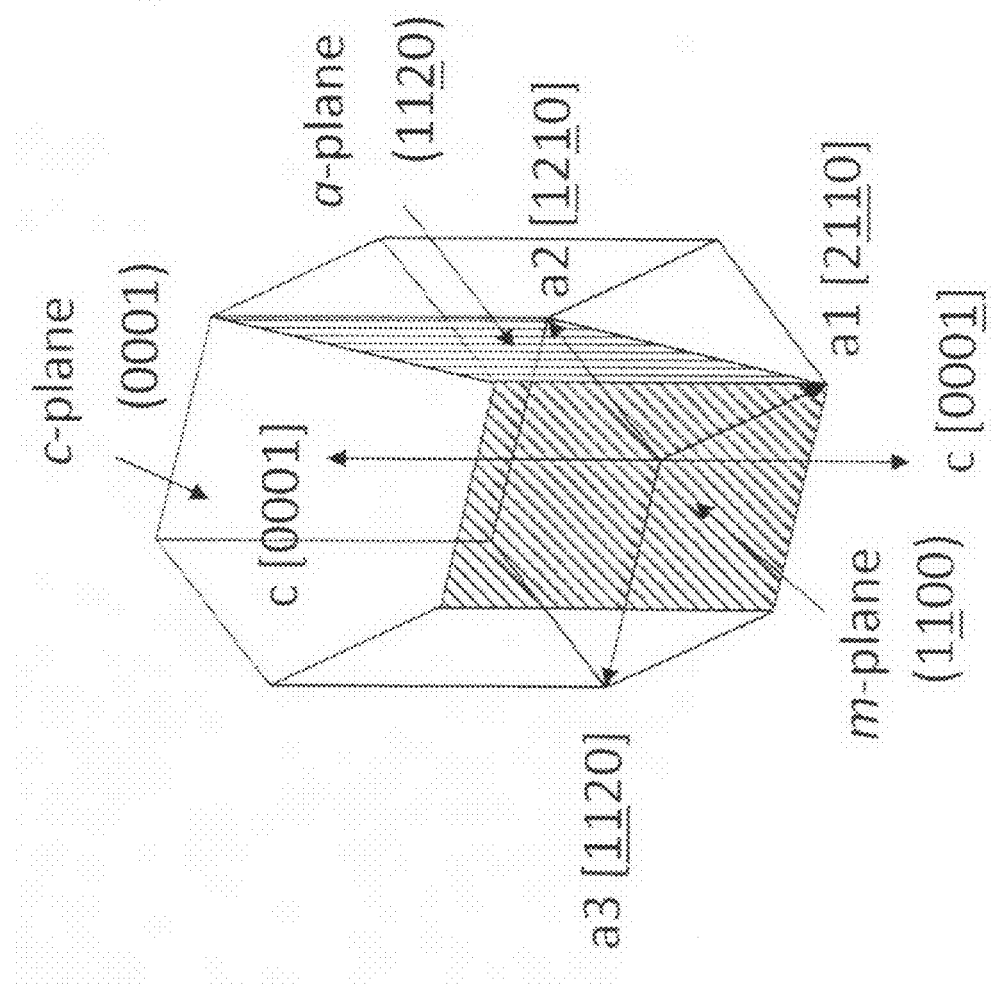
FIG. 1A is a schematic representation of the GaN hexagonal crystal structure showing the directions in the crystal and the (0001) polar crystal planes and the (1100) and (1120) non-polar crystal planes with their designations.

FIGS. 1A and 1B are provided for reference purposes in conjunction with the teachings of the present disclosure. FIG. 1A is a schematic representation of the GaN hexagonal crystal structure showing the directions in the crystal and the (0001) polar crystal planes and the (1100) and (1120) non-polar crystal planes with their designations. FIG. 1B is a schematic representation of the (1101) and (1122) semi-polar crystal planes in the GaN hexagonal crystal structure.

EXAMPLE 1

Figure 2:
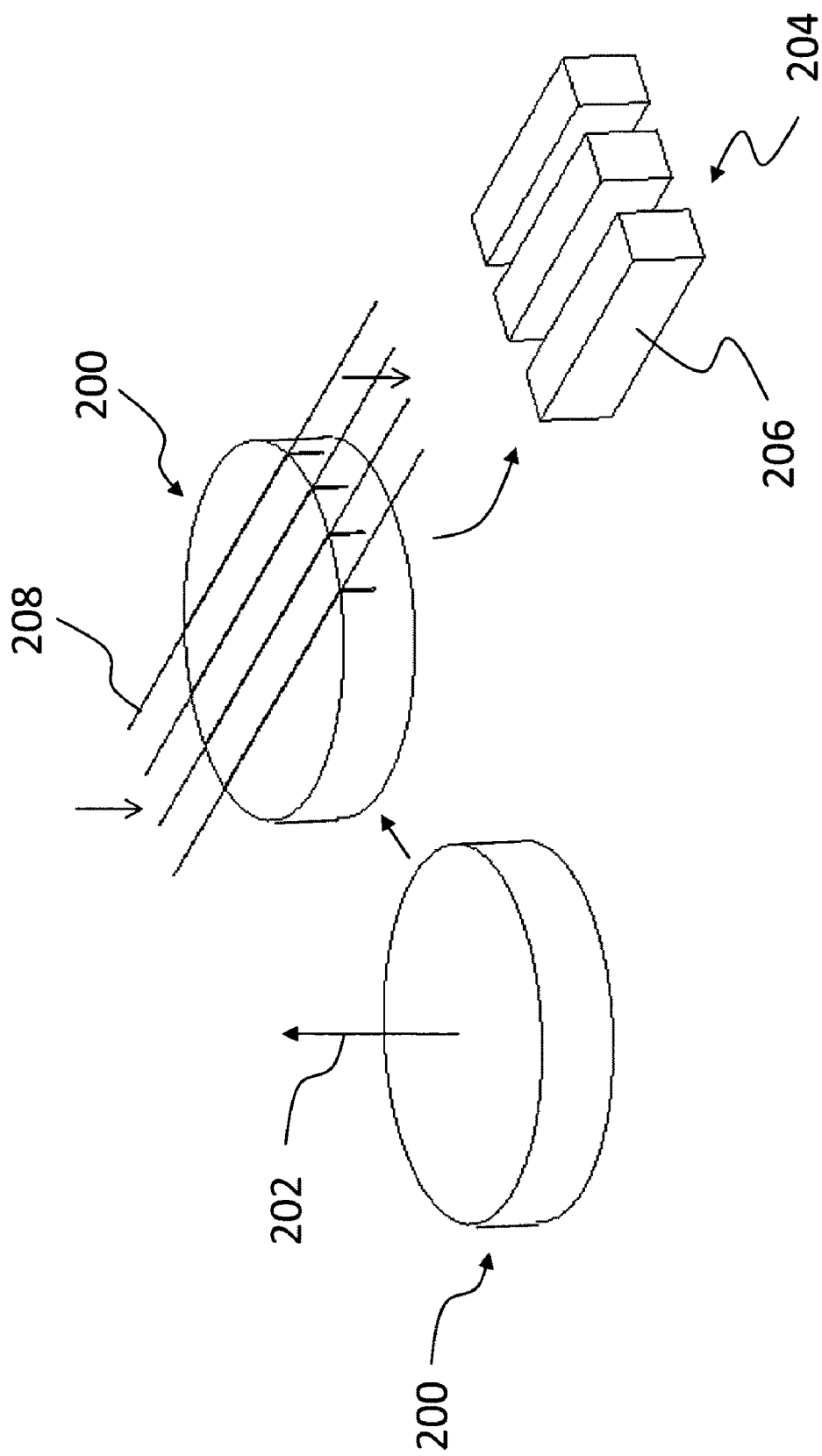
FIG. 2 is a schematic perspective view of an example of an as-grown GaN boule, and further illustrating the slicing of the GaN boule into non-polar GaN substrates that may be utilized as seed crystals according to the teachings of the present disclosure.

The following example is provided to illustrate an embodiment of the invention. Using the HVPE growth process, non-polar seed crystals were generated through the growth of thick GaN boules grown on AlN nucleation layers on sapphire substrates. These boules were grown to a thickness of ~1 cm. The sapphire substrates may be subsequently removed by any suitable technique. FIG. 2 is a schematic representation of an as-grown GaN boule 200 without the underlying sapphire and AlN nucleation layer. The growth of the GaN crystal along the c-axis ([0001] direction) to a thickness of, for example, about 1 cm, is indicated by an arrow 202. Following fabrication of the boules 200, they were prepared for slicing along the c-axis to create a- and m-plane substrates 204. The GaN crystalline directions in each boule 200 were identified via X-ray diffraction prior to slicing on a fixed-abrasive multi-wire saw. The sample boule 200 was mounted on an adjustable fixture in an X-ray diffractometer and the orientation of the boule crystal was measured using rocking curve (ω-scan) measurements. The X-ray measurement resulted in the identification of the orientation of the a- or m-plane in the crystal to within ±0.25° in both the polar and non-polar directions of the given plane. A representative a-plane or m-plane along which the boule 200 is to be sliced is designated 206 in FIG. 2. Following the X-ray measurements, the fixture was removed from the X-ray diffractometer and transferred and mounted in a fixed abrasive multi-wire saw 208. The boules 200 were then sliced parallel to the plane 206 as measured in order to produce either a- or m-plane substrates 204. After slicing, X-ray diffraction was used to measure the crystalline properties of the substrate 204. From the ω-scan angle offset in the rocking curve measurements, the accuracy of the non-polar substrate orientation is measured to be <±0.25° in both the polar (i.e. the [0001] direction) and the non-polar direction (i.e., the [1100] direction for a-plane substrates and the [1120] direction for m-plane substrates). X-ray characterization of the non-polar substrates 204 also showed that there is substantially no lattice tilting in the crystal along the in-plane polar and non-polar axes of the substrate 204, indicating a high degree of crystalline orientation and alignment within the substrate 204.

Following the slicing of the non-polar substrates 204, the substrates 204 were processed to prepare an epi-ready growth surface. The epi-ready growth surface lies in the m-plane or a-plane and, when the substrate 204 is subsequently loaded into a vertical vapor-phase growth chamber for use as a seed crystal as described below, corresponds to the top surface of the substrate 204. Where needed, a 30 μm diamond lap was used to planarize the substrates 204 and to produce flat substrates 204 with a thickness variation across each substrate 204 of ±5 μm. After lapping for flatness and to establish the final wafer thickness (in the present example, approximately 475 μm), the substrates 204 were polished using a 4-μm diamond mechanical polish, followed by a chemical-mechanical polish (CMP) step. Optimal polishing conditions were developed for both a- and m-plane substrate surfaces, and the CMP process times for obtaining smooth surfaces were different for the different substrates 204, owing to different removal rates for the same CMP process conditions. Atomic force microscope (AFM) measurements were made on the CMP-prepared a- and m-plane surfaces. RMS Roughness values of ~0.2 nm were achieved, which are comparable to those obtained on Ga-face (0001) c-plane substrates. In the AFM images, no polishing scratches were evident on the surfaces of the substrates 204 following the CMP process. The dimensions of the final substrates 204 were approximately 5 mm in the [0001] direction, 10 mm in the [1100] or [1120] directions (the orientation depending on whether the substrates are a-plane or m-plane), and approximately 450 μm thick in the [1120] or [1100] directions (the orientation again depending on whether the substrates are a-plane or m-plane).

Figure 3:
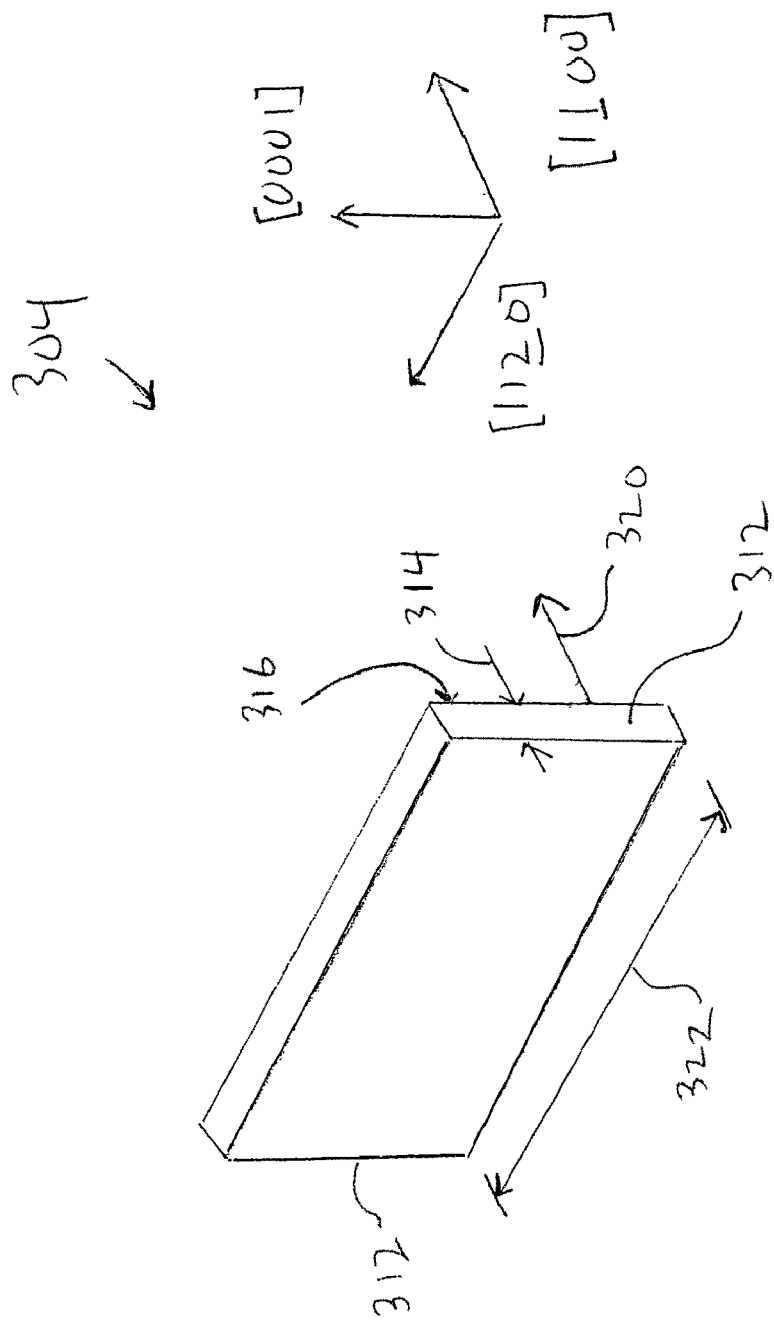
FIG. 3 is a schematic perspective view of an example of a non-polar GaN substrate according to the teachings of the present disclosure.

FIG. 3 is representative of a sample non-polar GaN substrate 304 that may be provided, such as by slicing a GaN boule as just described. In FIG. 3, the representative sample non-polar substrate 304 has an m-plane orientation, but alternatively could have an a-plane orientation as described above. The non-polar substrate 304 includes opposing side edges or sidewalls 312 running along the [0001] direction. As mentioned, the length (or depth) of these edges 312 is about 5 mm in the present example. In the case where the non-polar substrate 304 is an m-plane substrate, the non-polar substrate 304 has a thickness 314 in the [1100] direction, which thickness 314 as indicated in the present example may be about 450 or 475 μm depending on the amount of planarization, lapping, polishing, etc. performed. The non-polar substrate 304 thus has a top surface 316 lying in the m-plane. When this non-polar substrate 304 is loaded in a vertical HVPE reactor, the thickness 314 may be characterized as the vertical dimension of the non-polar substrate 304, and homoepitaxial GaN growth occurs along the m-axis as indicated by an arrow 320. The non-polar substrate 304 also has a lateral dimension 322 between and inclusive of the side edges 312. The lateral dimension 322 is generally orthogonal to the length of the side edges 312 and to the thickness 314. In the case where the non-polar substrate 304 is m-plane oriented, the lateral dimension 322 runs along the [1120] direction. As indicated above in the present example, the length of the lateral dimension is 10 mm.

Alternatively, in the case where the non-polar substrate 304 is a-plane oriented (not specifically shown), the thickness 314 of the non-polar substrate 304 runs in the [1120] direction. The top surface 316 of the non-polar substrate 304 lies in the a-plane. The lateral dimension 322 runs along the [1100] direction.

Further characterization of the non-polar GaN substrates (204 or 304) was investigated using several different techniques. X-ray rocking curve measurements for both the a- and m-plane substrates showed rocking curves full widths at half maximum (FWHM) of around 90 arcsec, which is considerably improved over heteroepitaxially grown a- and m-plane templates. Direct measurements of the dislocation density of the non-polar substrates were measured. Monochromatic cathodoluminescence (CL) images of both a- and m-plane substrates sliced from bulk GaN crystals allows an approximate estimation of the density of dislocations intersecting the sample surface. The dislocations intersecting the sample surface act as non-radiative recombination centers for electron-hole pairs generated during electron irradiation, allowing identification of these defects as dark regions in CL images. A dislocation density in the low range of $10^5$ cm$^{-2}$ was determined in the measured samples. These dislocation density measurements correlate well with transmission electron microscopy (TEM) observations performed on the a-plane GaN samples. Importantly, basal plane and/or prismatic stacking faults were not observed under any TEM observation conditions. These defects are usually prevalent in heteroepitaxially grown non-polar GaN films.

The non-polar a-plane (1120) and m-plane (1100) substrates were then prepared as seed crystals for epitaxial growth in a vertical HVPE growth system. The sample non-polar substrates were cleaned using a standard solvent clean in preparation for the growth. The sample non-polar substrates were mounted on a seed mount and loaded into the growth system in the orientation shown in FIG. 4 and described below. In any given growth run, either a-plane or m-plane substrates or both a-plane and m-plane substrates may be processed. The growth system was purged with process gases to obtain a high purity process environment and then the sample non-polar substrates were transferred into the heated deposition zone in the growth system. The sample non-polar substrates were heated to a temperature of 1085° C. under flowing nitrogen and ammonia (NH$_3$). Growth of GaN was initiated by introducing hydrogen chloride (HCl) into the growth system where it reacted in a vessel containing liquid gallium to form gallium chloride (GaCl). The GaCl was transported to the growth zone in the growth system in a flow of nitrogen. The initial growth rate was approximately 10 μm/hr, and was held for 20 minutes. The growth rate was then increased continuously to approximately 250 μm/hr. The growth pressure was 300 Torr. The total growth thickness in the vertical direction was approximately 400 μm on the surface of each of the non-polar substrates. Growth was terminated by stopping the flow of HCl. The resulting re-grown non-polar substrates were transferred out of the heated growth zone and were removed from the growth system.

The surfaces of the resulting re-grown non-polar substrates were analyzed following the above-described re-growth. The surfaces of the seed crystals prior to growth were smooth and featureless; post growth, the re-grown non-polar substrates have rougher, more textured surfaces, though both pre-growth and post-growth surfaces remained nearly mirror-like and reflective to the eye. Using Nomarski Interference Contrast optical microscopy, the surface features were investigated and crystalline faceting and texturing was observed. The a-plane crystals had a more faceted surface than the m-plane crystals. No cracking was observed in the re-grown non-polar substrates. Excellent material uniformity was observed in the HVPE re-growth on the non-polar GaN seeds.

AFM characterization was performed on the re-growth surface of the m-plane samples. The surface showed a generally smooth, step flow-type surface with a number of different observable growth features. Surface pits were seen across the samples. Pits such as these have been observed in regrowth on c-plane substrates. The pits could be associated with defects or dislocations intersecting the growth surface. The RMS roughness of the 5 μm×5 μm AFM scan is 4.9 nm. The density of the pits was approximately $1\times10^6$ cm$^{-2}$ in some areas; in other areas the surfaces were generally smooth with no pits.

X-ray rocking curve measurements were taken in two orientations following re-growth to observe the differences in crystal quality with respect to the different crystal directions in the samples, highlighting the in-plane anisotropy of the structural characteristics of the material. The X-ray source was configured in line source configuration that produced an incident beam with a spot size on the sample of approximately 1 mm (wide)×12 mm (tall). Measurements of this type have previously highlighted structural differences in HVPE-grown heteroepitaxial and bulk material. The first measurement (0° orientation) was taken with the incident beam parallel to the [1120] direction of the m-plane sample; the next measurement (90° orientation) was taken with the incident beam normal to the [1120] direction. For the m-plane sample, the 0° measurement shows a rocking curve full width at half maximum (FWHM) of 73 arcsec, while the 90° measurement has a FWHM of 202 arcsec. The 0° measurement consists of one main peak with several shoulder peaks of lower intensity, while the 90 shows one main peak with a more pronounced domain structure. The small FWHM values are indicative of high crystal quality, while the multiple diffraction peaks could be indicative of a domain-type structure in the material. Similar rocking curve measurements were observed on the a-plane sample.

Figure 4:
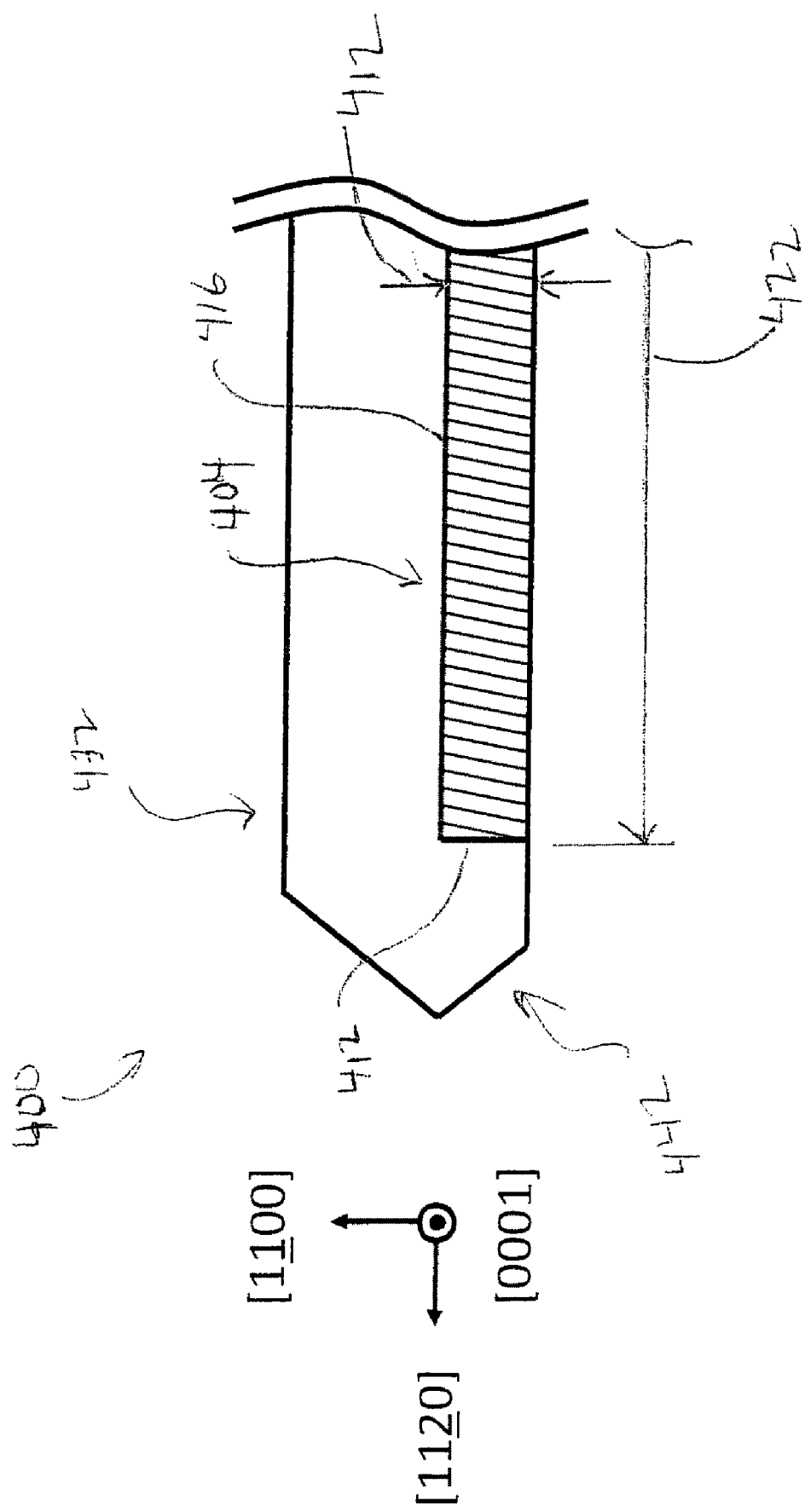
FIG. 4 is a schematic, cross-sectional elevation view of an example of a GaN crystal after vapor phase re-growth on a non-polar GaN seed according to implementations taught in the present disclosure, and further showing crystallographic directions and their relation to the regrowth.

FIG. 4 is a schematic view of the cross-section of an m-plane non-polar substrate 400 following re-growth from a non-polar starting seed crystal 404. The starting seed crystal 404 corresponds to the representative non-polar substrate 304 illustrated in FIG. 3, or one of the non-polar substrates 204 illustrated in FIG. 2, after having been reoriented and mounted in a vertical HVPE chamber as described above. Accordingly, for the r-plane sample illustrated in FIG. 4, the starting seed crystal 404 has a thickness 412 corresponding to a vertical dimension and a length or width 422 corresponding to a lateral dimension. The starting seed crystal 404 also includes a top surface 416 generally oriented along the m-plane, and one or more side edges 412 generally running along the [1100] direction. Here, the term "one or more side edges" infers that the shape of the starting seed crystal 404 may be more or less rectilinear as shown for example in FIGS. 2 and 3 such that four distinct side edges 412 are defined, or alternatively the starting seed crystal may be shaped differently so as to have more or less side edges 412, or further that the starting seed crystal 404 may be more or less rounded so as to have a single continuous side edge 412 defining the perimeter of the top surface 416. As a result of the vapor-phase re-growth process described above, growth of the GaN crystal in the [1100] and [1120] directions is observed, which in the present example corresponds to the vertical and lateral directions, respectively. Consequently, the resulting re-grown non-polar substrate 400 includes a vertical re-growth region 432 characterized by growth from the top surface 416 and hence an increased vertical dimension of the GaN crystal, and a lateral re-growth region 442 characterized by growth from the side edge(s) 412 and hence an increased lateral dimension of the GaN crystal. Growth in the [0001] and [0001] directions (i.e., out from and into the drawing sheet) is not specifically shown.

Figure 5:
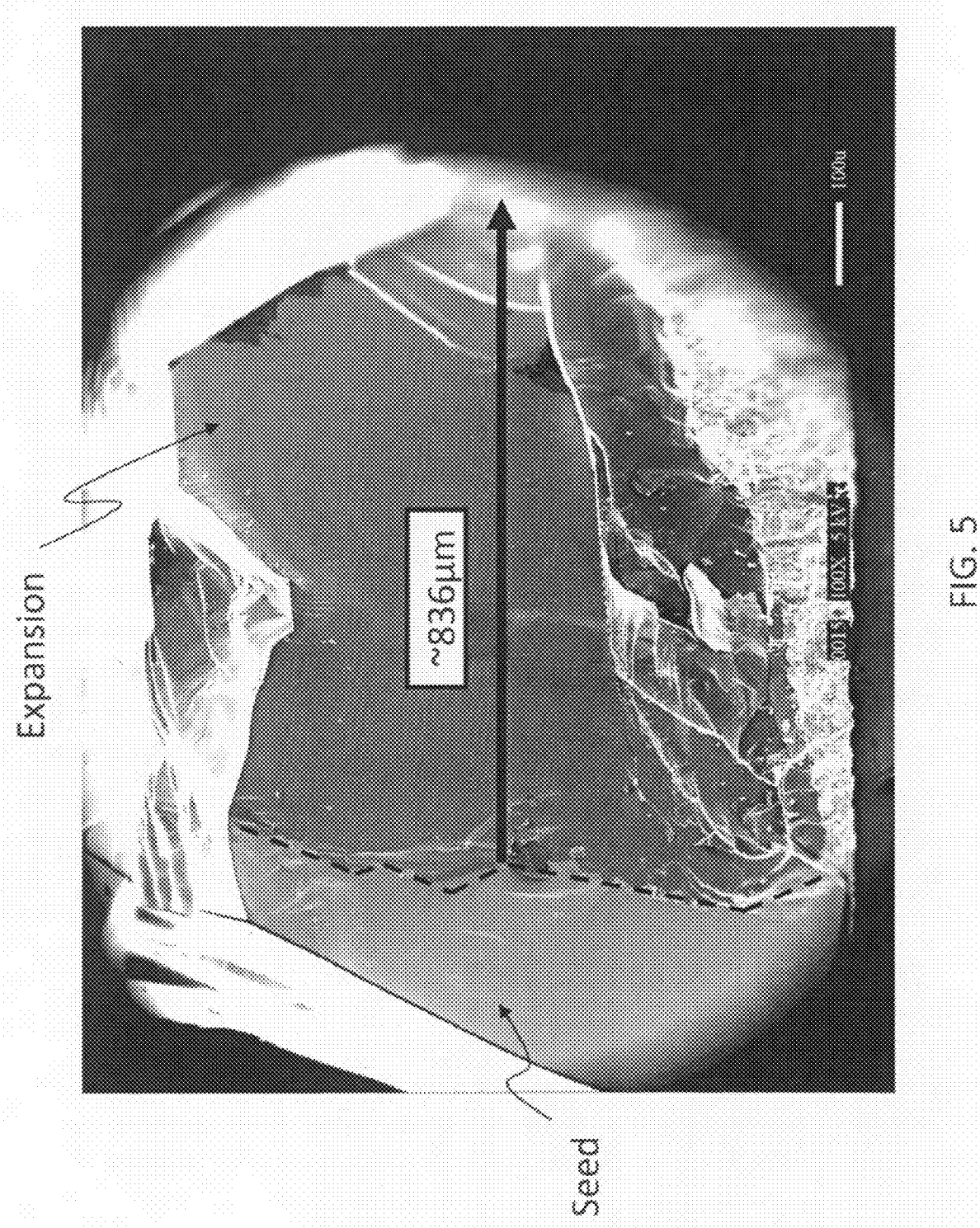
FIG. 5 is a scanning electron microscope image of a re-grown GaN crystal resulting from the lateral expansion of an m-plane seed crystal following HVPE re-growth according to implementations taught in the present disclosure.

The highest growth rate is observed in the [1120] (lateral) direction and faceting is observed in the <1100> (vertical) growth directions. Growth expansion was also observed in the [0001] direction (out of the drawing sheet), and was comparable in growth rate to the growth in the [1120] direction. Lower growth rates relative to the [0001] direction were observed in the [0001] direction (into the drawing sheet). Scanning electron microscopy (SEM) was used to characterize the seeds 404 and the regrowth 432 and 442. Using this technique, regrowth 442 from the sidewall 412 of the seed 404 was observed and the growth rate was characterized. FIG. 5 is a SEM micrograph of a cleaved surface from the m-plane re-growth looking in the [0001] direction. The contrast difference between the seed and the regrowth regions shows the area of the crystal formed during regrowth. The dashed line in FIG. 5 defines the interface between these two regions. The measurement of the seed expansion in this section via SEM also shows a higher lateral growth rate than the vertical growth rate. The nominal vertical growth rate for this sample is approximately 250 µm/hr, whereas the lateral growth rate is measured to be greater than approximately 400 µm/hr. As shown in FIG. 5, lateral re-growth from one side of the seed crystal in this example was measured to be 836 µm. This demonstrates successful seed expansion and increasing the lateral size of non-polar substrates starting with non-polar seeds.

EXAMPLE 2

The following example is provided to illustrate another embodiment of the invention. The GaN boules and non-polar seed crystals formed pursuant to this example may be formed as described above in conjunction with FIGS. 2 and 3, and thus can be expected to exhibit the same or similar excellent properties and characteristics mentioned below for this example. Accordingly, the HVPE growth process may again be utilized to generate non-polar seed crystals through the growth of thick GaN boules grown on AlN nucleation layers on sapphire substrates. GaN boules may be grown to a thickness of, for example, ~1 cm. Following fabrication of the boules, they are prepared for slicing along the c-axis to create m-plane substrates. The GaN crystalline directions in the boule are identified via X-ray diffraction prior to slicing on a fixed-abrasive multi-wire saw. For the alignment measurement, the boule is mounted on an adjustable fixture in an X-ray diffractometer and the orientation of the boule crystal is measured using rocking curve (ω-scan) measurements. Alternatively, the alignment of the boule is measured using the X-ray back-reflection Laue method. The X-ray measurement results in the identification of the orientation of the m-plane in the crystal to within ±0.25° in both the polar and non-polar direction of the given plane. Following the X-ray measurements, the fixture is removed from the X-ray diffractometer and transferred and mounted in a fixed abrasive multi-wire saw. The boules are then sliced parallel to the plane as measured and oriented in the diffractometer in order to produce m-plane substrates. After slicing, X-ray diffraction is used to verify the quality and orientation of the substrate. X-ray rocking curve measurements for both the a- and m-plane substrates show rocking curves full widths at half maximum (FWHM) of around 90 arcsec. From the 107 -scan angle offset in the rocking curve measurements, the accuracy of the non-polar substrate orientation is measured to be <±0.25° in both the polar (i.e. the [0001] direction) and the non-polar direction (i.e., the [1100] direction for a-plane substrates and the [1120] direction for m-plane substrates). X-ray characterization of the non-polar substrates also show that there is substantially no lattice tilting in the crystal along the in-plane polar and non-polar axes of the substrate, indicating a high degree of crystalline orientation and alignment within the substrate. The multi-wire saw produces a flat substrate with a thickness variation across the substrate of ±5 µm.

Following the slicing of the non-polar substrates, the substrates are then processed to prepare an epi-ready growth surface. After lapping for flatness and to establish the final wafer thickness (approximately 475 µm), the substrates are polished using sequential 4-µm and 1-µm diamond mechanical polish steps, followed by a chemical-mechanical polish (CMP) step. RMS Roughness values of ~0.2 nm are achieved, as measured by AFM. In the AFM images, no polishing scratches are evident on the surfaces of the substrates following the CMP process. Monochromatic cathodoluminescence (CL) images of the m-plane substrates show the dislocation density is in the low range of $10^5$ cm$^{-2}$. Basal plane and/or prismatic stacking faults are not observed under any TEM observation conditions. The final substrate size is approximately 5 mm in the [0001] direction and 10 mm in the [1120] direction, and approximately 450 µm thick in the [1100] direction.

The non-polar m-plane (1100) substrates are then prepared as seed crystals for epitaxial growth in a vertical HVPE system. The samples are cleaned using a standard solvent clean in preparation for the growth. The samples are mounted on a seed mount and loaded into the growth system. The system is purged with process gases to obtain a high purity process environment and then the samples are transferred into the heated deposition zone in the growth system. The sample is heated to a temperature of 1085° C. under flowing nitrogen and ammonia. Growth of GaN is initiated by introducing HCl into the system where it reacts with liquid gallium to form GaCl, and then is transported to the growth zone in the system in a flow of nitrogen. The initial growth rate is approximately 10 µm/hr, and is held for 20 minutes. The growth rate is then increased continuously to 250 µm/hr. The growth pressure is 300 Torr. The total growth thickness is approximately 5 mm in the vertical [1100] direction on the surface of the substrates. Growth is terminated by stopping the flow of HCl. The sample is transferred out of the heated growth zone and is removed from the system. The lateral dimensions of the re-grown crystal are approximately 10 mm in the [0001] direction and 20 mm in the [1120] direction.

Figure 6:
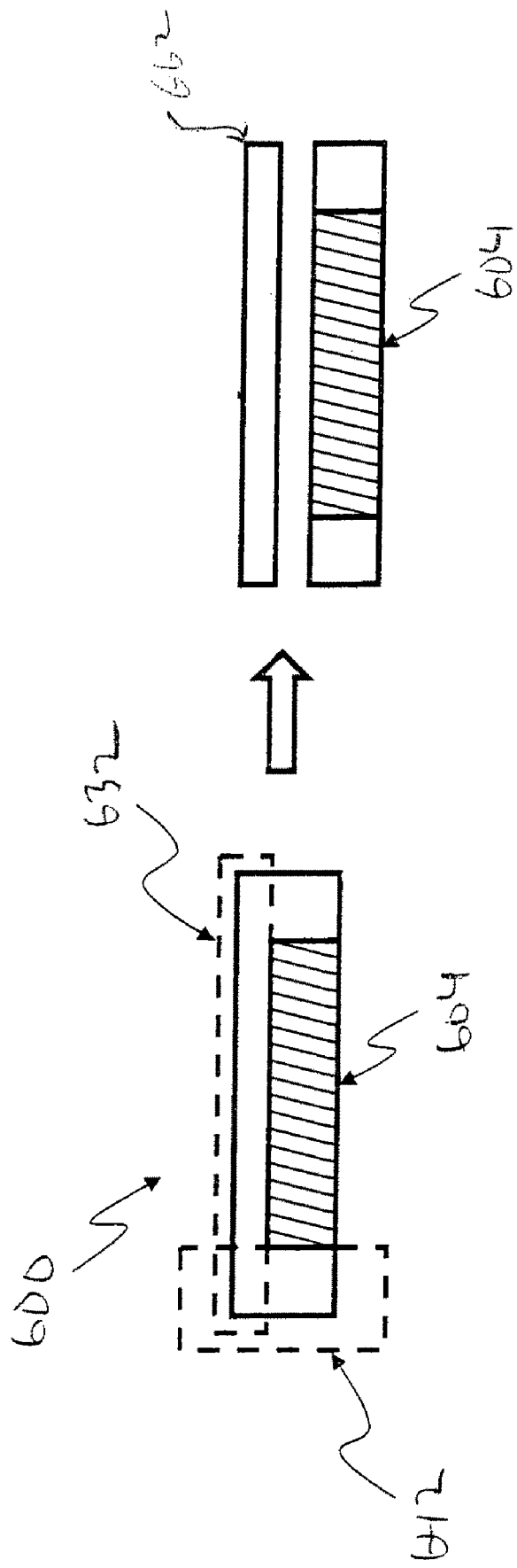
FIG. 6 is a schematic cross-sectional elevation view of an example of a GaN crystal after vapor phase re-growth on a non-polar GaN seed, and further showing the subsequent separation of a GaN substrate from the underlying seed, thereby producing a large-area, non-polar GaN substrate according to implementations taught in the present disclosure.

FIG. 6 is a schematic representation of a re-grown GaN crystal 600 produced as just described, and also of the separation of one or more GaN substrates 662 from the re-grown crystal 600 as described below. Similar to FIG. 4, the re-grown crystal 600 includes a starting seed crystal 604, a vertical re-growth region 632 and one or more lateral re-growth regions 642. Following the crystal re-growth, the re-grown crystal 600 is prepared for slicing parallel to the c-axis to create one or more m-plane substrates 662. The GaN crystalline directions in the re-grown crystal 600 are identified via X-ray diffraction prior to slicing on a fixed-abrasive multi-wire saw. The X-ray measurement resulted in the identification of the orientation of the a- or m-plane in the re-grown crystal; from this measurement the orientation of the surface plane of the substrate (the off-cut angle) was selected and determined with an accuracy of ±0.25° from a selected angle and toward a direction relative to the direction normal to the a- or m-plane in the crystal. For example, in one instance the orientation of the surface plane of the m-plane substrate 662 was selected to be oriented to 0°±0.25° from the m-plane in both the polar and non-polar directions of the given plane. In another example, the orientation of the surface plane of the m-plane substrate 662 is selected to be oriented to 1°±0.25° from the m-plane toward the [0001] direction and 0°±0.25° from the m-plane toward the [1120] direction. In general, the off-cut angle of the surface plane of the non-polar substrates is selected over a range of ±5° with an accuracy of =0.25°, where these angles are measured relative to the direction normal to the non-polar plane that is nominally parallel to the top surface of the starting seed crystal, and the direction of the off-cut angle is determined relative to two crystalline directions in the plane of the non-polar plane that is nominally parallel to the top surface of the starting seed crystal. For simplicity, these two crystalline directions are normally taken to be the two lowest order crystalline directions in the plane of interest. The re-grown crystal 600 is then sliced parallel to the plane as measured in order to produce the m-plane substrates 662. Each of the resulting sliced m-plane substrates 662 is then polished to achieve a smooth and damage-free surface suitable for subsequent epitaxial growth, the fabrication of electronic or optoelectronic devices, etc. As seen in FIG. 6, in accordance with the fabrication process taught in the present example, the resulting m-plane substrates 662 retain the increased lateral dimension in the [1120] direction from the re-growth, relative to the original lateral dimension of the starting seed crystal 604. Hence, the area of the top surface of each resulting m-plane substrate 662 may be greater than the area of the top surface of the starting seed crystal 604.

The foregoing example may also be applied by analogy to the process of re-growth on a-plane seed crystals in accordance with the present teaching to produce sliced a-plane substrates.

Figure 7:
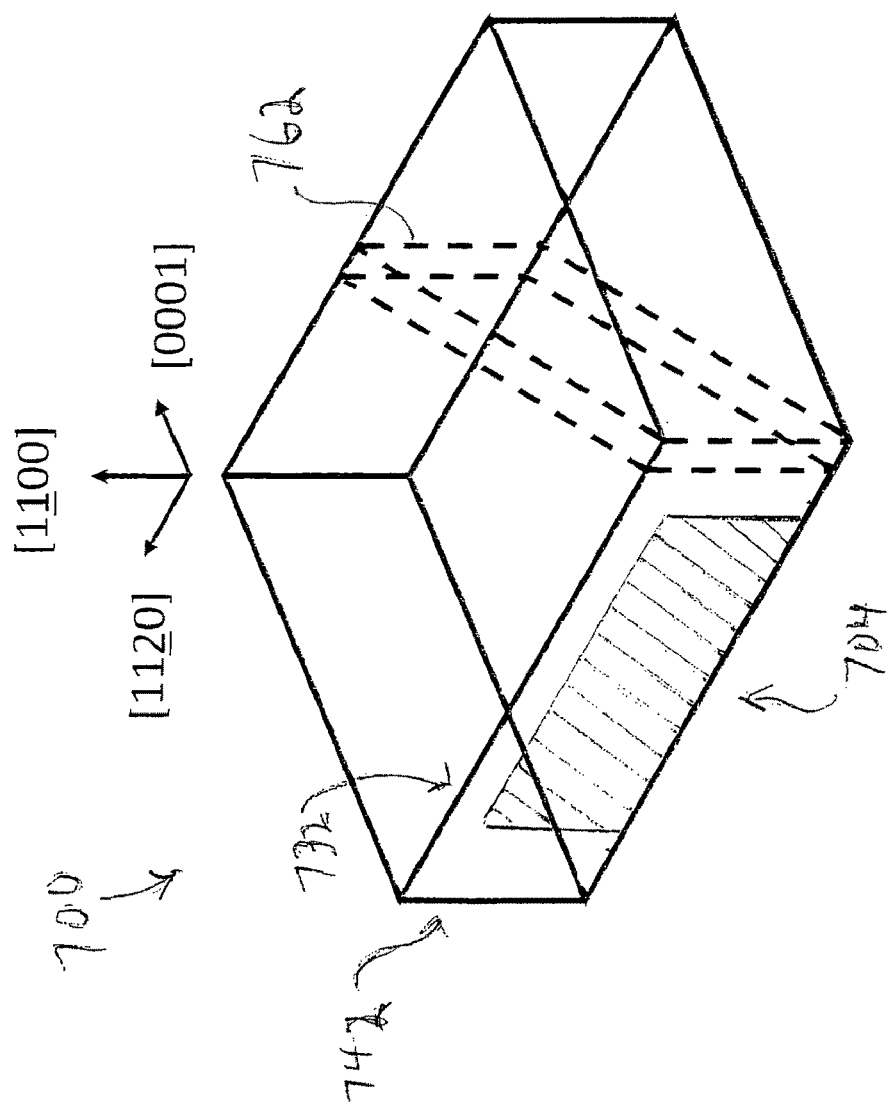
FIG. 7 is a schematic cross-sectional elevation view of an example of a GaN crystal after vapor phase re-growth on a non-polar GaN seed, and further showing the subsequent separation of a GaN substrate from the underlying seed, thereby producing a large-area, non-polar GaN substrate according to other implementations taught in the present disclosure.

FIG. 7 illustrates an alternative approach to the present example. Similar to FIGS. 4 and 6, FIG. 7 illustrates a re-grown GaN crystal 700 exhibiting vertical and lateral re-growth regions 732 and 742 generated from a starting seed crystal 704. For simplicity, the cross-section of the seed crystal 704 is depicted only on one of the faces or sides of the re-grown GaN crystal 700. In this alternative example, following crystal re-growth, the resulting re-grown crystal 700 is prepared for slicing parallel to the [1100] direction and at approximately 58.4° relative to the [1120] direction to create one or more (1122) substrates 762. The GaN crystalline directions in the re-grown crystal 700 are identified via X-ray diffraction prior to slicing on a fixed-abrasive multi-wire saw. The re-grown crystal 700 is then sliced parallel to the plane as measured in order to produce the (1122) substrates 762. Each of the resulting sliced (1122) substrates 762 is then polished to achieve a smooth and damage-free surface suitable for epitaxial growth. It will be noted in this example that the sliced substrates 762 may include crystal material from the seed crystal 704 as well as the re-grown crystal 732 and/or 742.

The foregoing alternative example relating to FIG. 7 may be applied by analogy to the process of re-growth on a-plane seed crystals. For example, an a-plane seed crystal may be sliced parallel to the [1120] direction at an angle that results in the creation of one or more (1101) substrates.

Continuing with FIG. 7, the starting seed crystal 704 has a cross-sectional area defined by its lateral and vertical dimensions. In any of the implementations described in conjunction with FIG. 7, it can be seen that the area of a planar surface (e.g., top surface) of the substrate sliced from the re-grown crystal may be greater than the cross-section area of the seed crystal 704.

EXAMPLE 3

Figure 8:
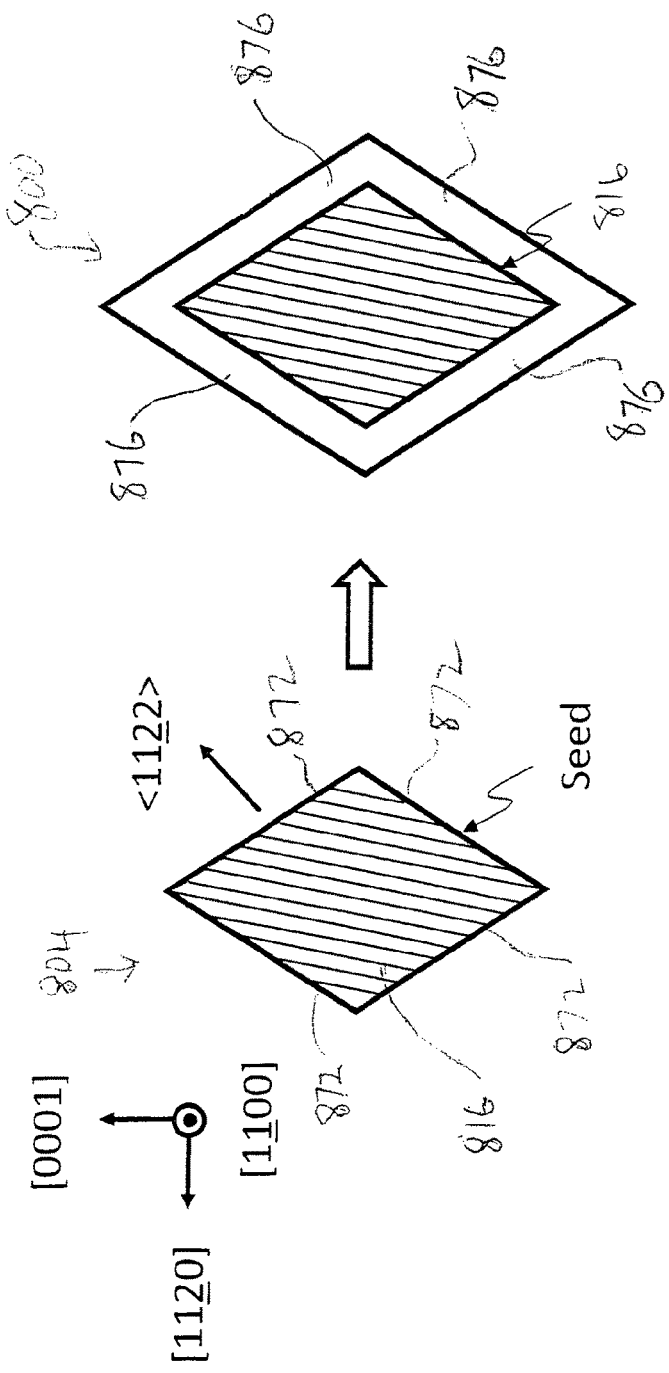
FIG. 8 is a schematic top plan view of an example of a GaN seed crystal cleaved to attain edges of desired crystallographic orientation, and further illustrating crystal re-growth from these edges according to other implementations taught in the present disclosure.

The following example is provided to illustrate another embodiment of the invention. As in the case of the implementations of Example 2, the GaN boules and non-polar seed crystals formed pursuant to the present example may be formed as described above in conjunction with FIGS. 2 and 3, and thus can be expected to exhibit the same or similar excellent properties and characteristics mentioned above. Accordingly, the HVPE growth process may again be utilized to generate non-polar seed crystals through the growth of thick GaN boules using the process previously described. For example, the size of the m-plane substrates resulting from slicing the GaN boule, and following preparatory steps as described above, may be approximately 5 mm in the [0001] direction and 10 mm in the [1120] direction, and approximately 450 μm thick in the [1100] direction. These substrates may then be utilized as seed crystals for the re-growth process. FIG. 8 schematically depicts a top surface 816 of one such seed crystal 804. For simplicity, the thickness and corresponding three-dimensional bulk of the seed crystal 804 are omitted from FIG. 8. In this example, prior to re-growth, the seed crystal 804 is cleaved along crystalline planes to generate a seed crystal 804 that is bounded exclusively by {1122} edges 872. Alternatively, the {1122} edges 872 are produced by cutting or grinding the seed crystal 804 followed by polishing or etching the edges 872 to remove damage from the mechanical processing. To obtain the proper alignment of the edges 872 to the desired crystal plane, the GaN crystalline directions in the seed crystal 804 are identified via X-ray diffraction prior to cleaving, cutting, or grinding.

The non-polar m-plane (1100) seed crystals 804 with the {1122} edges 872 are then prepared for epitaxial growth in a vertical HVPE system. The sample seed crystals 804 are cleaned using a standard solvent clean in preparation for the growth. The sample seed crystals 804 are mounted on a seed mount and loaded into the growth system. The system is purged with process gases to obtain a high purity process environment and then the samples are transferred into the heated deposition zone in the growth system. In order to maintain the {1122} facets of the seed crystal 804, the growth conditions are modified to stabilize the growth on the {1122} facets. The seed crystal 804 is heated to a temperature of 1075° C. under flowing nitrogen and ammonia. Growth of GaN is initiated by introducing HCl into the system where it reacts with liquid gallium to form GaCl, and then is transported to the growth zone in the system in a flow of nitrogen. The initial growth rate is approximately 10 μm/hr, and is held for 20 minutes. The growth rate is then increased continuously to 250 μm/hr. The growth pressure was 300 Torr. Under these growth conditions, lateral re-growth is promoted on the {1122} sidewalls 872 of the seed crystal 804 as schematically depicted in FIG. 8 by lateral growth regions 876, thereby forming a re-grown GaN crystal 800.

Following crystal re-growth, the re-grown GaN crystal 800 is prepared for slicing along the c-axis to create one or more m-plane substrates. The GaN crystalline directions in the re-grown crystal 800 are identified via X-ray diffraction prior to slicing on a fixed-abrasive multi-wire saw. The re-grown crystal 800 is then sliced parallel to the plane as measured and oriented in the diffractometer in order to produce m-plane substrates. For example, slicing may occur parallel to the top surface 816. Each of the substrates may then be polished to achieve a smooth and damage-free surface suitable for epitaxial growth.

The example just described may be applied by analogy to seed crystals of other crystallographic orientations. As examples, the seed crystal may be of (1120) orientation with {1101} crystalline edges, the seed crystal may be of (0001) orientation with {1100} crystalline edges, or the seed crystal may be of (0001) orientation with {1120} crystalline edges.

In the examples presented, impurities may or may not be intentionally introduced in the gas phase during the crystal growth. In some implementations, during the vapor phase re-growth, no impurity is introduced and all the gas sources are purified in order to achieve high-purity GaN crystals. In some examples, the impurity concentration in the GaN is than about $10^{17}$ cm$^{-3}$. In other examples, the impurity concentration is less than about $10^{16}$ cm$^{-3}$. In other examples, the impurity concentration is less than about $10^{15}$ cm$^{-3}$.

Alternatively, in other implementations, during the bulk growth, n-type impurities, such as silicon (introduced, for example, as silane) or oxygen, are introduced to produce n-type GaN crystals. The introduction of impurities may occur at any stage of the GaN growth. It will be understood that the growth conditions may be slightly different when n-type doping is introduced. In some examples, the electron concentration in the vapor phase re-growth GaN layer is greater than about $10^{17}$ cm$^{-3}$. In other examples, the electron concentration is greater than about $10^{18}$ cm$^{-3}$. In some examples, the resistivity of the n-type vapor phase re-growth GaN layer is less than about 0.1 ohm-cm.

In other implementations, the bulk GaN crystal may be p-type doped by introducing p-type impurities such as magnesium (Mg). Mg may be introduced as a metal-organic compound. Mg may also be introduced as Mg vapor by heating Mg metal in a quartz enclosure and carrying the Mg to the deposition zone by carrier gas. It will be understood that the growth conditions may be slightly different when p-type doping is introduced. In some examples, the hole concentration in the vapor phase re-growth GaN layer is greater than about $10^{17}$ cm$^{-3}$. In other examples, the hole concentration is greater than about $10^{18}$ cm$^{-3}$. In other examples, the hole concentration is greater than about $10^{19}$ cm$^{-3}$. In some examples, the resistivity of the p-type vapor phase re-growth GaN layer is less than about 0.1 ohm-cm.

In other implementations, the bulk GaN crystal can also be made into a semi-insulating (SI) material by introducing a deep-level acceptor. Transition metals, such as iron, cobalt, nickel, manganese, and zinc, are deep-level acceptors. The transition metal may be introduced to the deposition zone either via a metal-organic or metal-chloride compound formed by reacting, for example, iron metal with hydrochloric acid. When iron is used as a deep-level acceptor, gaseous ferrocene may be introduced into the HVPE reactor. It will be understood that the growth conditions may be slightly different when transitional metal doping is introduced. The concentration of the transition metal in the vapor phase re-growth GaN layer may range from about $10^{16}$ to about $10^{20}$ cm$^{-3}$. In other examples, the concentration of the transition metal ranges from about $10^{17}$ to about $10^{19}$. In other examples, the concentration of the transition metal is around $10^{18}$ cm$^{-3}$. The resistivity of the SI vapor phase re-growth GaN layer at room temperature may be greater than about $10^6$ ohm-cm.

The substrates formed using the present invention are very useful for producing optoelectronic devices such as light emitting diodes (LEDs), laser diodes (LDs) and photodetectors, and electronic devices such as diodes and field effect transistors (FETs). Accordingly, implementations of the present invention include articles comprising the substrates with additional GaN layers and/or GaN-based (opto-) electronic devices fabricated thereon. Depending on whether the substrates are non-polar or semi-polar, the resulting articles or device are spontaneous-polarization-free or otherwise exhibit low spontaneous polarization.

Examples of the present invention utilize several specific growth sequences. It should be understood that these specific growth processes are meant for illustrative purposes and are not limiting. It should also be noted that growth conditions cited in the examples are specific to the HVPE growth reactor employed in the examples. When employing a different reactor design or reactor geometry, it may be desirable to utilize a different condition to achieve similar results. However, the general trends are still similar.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for making a non-polar GaN substrate, comprising:

providing a non-polar GaN seed crystal including a top surface lying in a first non-polar plane, and one or more side walls adjoining the top surface, wherein the non-polar GaN seed crystal has a vertical dimension bounded by the top surface and a bottom surface, and a lateral dimension bounded by the one or more side walls and orthogonal to the vertical dimension;

growing a vertical re-growth region from the top surface and a lateral re-growth region from the one or more side walls to form a re-grown GaN crystal, by growing GaN on the non-polar GaN seed crystal utilizing a vapor phase growth process, wherein the re-grown GaN crystal has a vertical dimension greater than the vertical dimension of the non-polar GaN seed crystal and a lateral dimension greater than the lateral dimension of the non-polar GaN seed crystal; and slicing the re-grown GaN crystal along a second non-polar plane to form a non-polar GaN substrate, wherein the non-polar GaN substrate has a lateral dimension along the second non-polar plane, and the lateral dimension of the non-polar GaN substrate is greater than the lateral dimension of the non-polar GaN seed crystal.

2. The method for making a non-polar GaN substrate according to claim 1, wherein the first non-polar plane and the second non-polar plane have a (1100) orientation.

3. The method for making a non-polar GaN substrate according to claim 1, wherein the first non-polar plane and the second non-polar plane have a (1120) orientation.

4. The method for making a non-polar GaN substrate according to claim 1, wherein the first non-polar plane has a (1100) orientation and the second non-polar plane has a (1122) orientation.

5. The method for making a non-polar GaN substrate according to claim 1, wherein the first non-polar plane has a (1120) orientation and the second non-polar plane has a (1101) orientation or a (1103) orientation.

6. The method for making a non-polar GaN substrate according to claim 1, wherein the vertical re-growth region has a vertical dimension of 500 µm or greater.

7. The method for making a non-polar GaN substrate according to claim 1, wherein the lateral re-growth region has a lateral dimension of 800 µm or greater.

8. The method for making a non-polar GaN substrate according to claim 1, wherein the top surface has an area of 25 mm$^2$ or greater.

9. The method for making a non-polar GaN substrate according to claim 1, wherein the top surface is bounded by two or more edges and the smallest edge is 3 mm or greater.

10. The method for making a non-polar GaN substrate according to claim 1, wherein the non-polar substrate has a top surface lying in the second non-polar plane, and the top surface of the non-polar substrate has an area greater than the area of the top surface of the non-polar GaN seed crystal.

11. The method for making a non-polar GaN substrate according to claim 1, wherein the non-polar GaN seed crystal has a cross-sectional area defined by the vertical dimension of the non-polar GaN seed crystal and the lateral dimension of the non-polar GaN seed crystal, the non-polar GaN substrate includes a top surface lying along the direction of slicing, and the top surface of the non-polar GaN substrate has an area greater than the cross-sectional area of the non-polar GaN seed crystal.

12. The method for making a non-polar GaN substrate according to claim 1, wherein the off-cut angle of the non-polar GaN substrate sliced from the re-grown GaN crystal is selected from a range of ±5°, where the angle is measured relative to the direction normal to the non-polar plane that is nominally parallel to the top surface of the starting non-polar GaN seed crystal, and the direction of the off cut angle is determined relative to the two lowest order crystalline directions in the plane of the non-polar plane that is nominally parallel to the top surface of the starting non-polar GaN seed crystal, and the angle is determined with an accuracy of ±0.25°.

13. The method for making a non-polar GaN substrate according to claim 1, wherein the dislocation density of the re-grown GaN crystal in the re-growth regions is approximately the same or lower than that of the non-polar GaN seed crystal.

14. The method for making a non-polar GaN substrate according to claim 1, further comprising lapping and polishing the non-polar GaN substrate whereby the non-polar GaN substrate is suitable for epitaxial growth thereon.

15. The method for making a non-polar GaN substrate according to claim 1, further comprising growing an additional GaN layer or a GaN-based device on the non-polar GaN substrate, wherein the additional GaN layer or the GaN-based device is spontaneous-polarization-free or exhibits low spontaneous polarization.

16. The method for making a non-polar GaN substrate according to claim 1, wherein the growth rate in the lateral re-growth region is 400 μm or greater.

17. The method for making a non-polar GaN substrate according to claim 1, wherein the growth rate in the lateral re-growth region is greater than the growth rate in the vertical re-growth region.

18. The method for making a non-polar GaN substrate according to claim 1, wherein the ratio of the growth rate in the lateral re-growth region to the growth rate in the vertical re-growth region is 1.6:1 or greater.

19. The method for making a non-polar GaN substrate according to claim 1, wherein providing the non-polar GaN seed crystal comprises slicing a GaN crystal boule along its c-axis and parallel to the first non-polar plane.

20. A method for making a re-grown GaN crystal, comprising:
providing a GaN seed crystal including a top surface and a plurality of crystalline edges of equivalent crystallographic direction adjoining the top surface, wherein the GaN seed crystal has a vertical dimension bounded by the top surface, and a lateral dimension bounded by an opposing pair of the plurality of crystalline edges and orthogonal to the vertical dimension; and
growing a lateral re-growth region from each of the plurality of crystalline edges to form a re-grown GaN crystal, by growing GaN on the GaN seed crystal utilizing a vapor phase growth process, wherein the re-grown GaN crystal has a lateral dimension inclusive of the lateral re-growth regions grown from the opposing pair of the plurality of crystalline edges, and the lateral dimension of the re-grown GaN crystal is greater than the lateral dimension of the GaN seed crystal.

21. The method for making a re-grown GaN crystal according to claim 20, wherein the GaN seed crystal is of (1100) orientation with (1122) crystalline edges.

22. The method for making a re-grown GaN crystal according to claim 20, wherein the GaN seed crystal is of (1120) orientation with (1101) crystalline edges.

23. The method for making a re-grown GaN crystal according to claim 20, wherein the GaN seed crystal is of (0001) orientation with (1100) crystalline edges.

24. The method for making a re-grown GaN crystal according to claim 20, wherein the GaN seed crystal is of (0001) orientation with (1120) crystalline edges.

25. The method for making a re-grown GaN crystal according to claim 20, further comprising slicing along a direction parallel to the top surface to form a non-polar GaN substrate, wherein the non-polar GaN substrate has a lateral dimension inclusive of the lateral re-growth regions grown from the opposing pair of the plurality of crystalline edges, and the lateral dimension of the non-polar GaN substrate is greater than the lateral dimension of the GaN seed crystal.

26. The method for making a re-grown GaN crystal according to claim 20, further comprising lapping and polishing the non-polar GaN substrate whereby the non-polar GaN substrate is suitable for epitaxial growth thereon.

27. The method for making a re-grown GaN crystal according to claim 20, wherein the growth rate in each lateral re-growth region is approximately equal to the growth rate in the other lateral re-growth regions.

28. The method for making a re-grown GaN crystal according to claim 20, further comprising, while growing the lateral re-growth regions, growing a vertical re-growth region from the top surface, wherein the growth rate in the lateral re-growth regions is greater than the growth rate in the vertical re-growth region.

29. A method for making a re-grown GaN crystal, comprising:
providing a non-polar GaN seed crystal including a top surface lying in a non-polar plane, and one or more side walls adjoining the top surface, wherein the non-polar GaN seed crystal has a vertical dimension bounded by the top surface, and a lateral dimension bounded by the one or more side walls and orthogonal to the vertical dimension; and
growing a vertical re-growth region from the top surface and a lateral re-growth region from the one or more side walls to form a re-grown GaN crystal, by growing GaN on the non-polar GaN seed crystal utilizing a vapor phase growth process, wherein a growth rate in the lateral re-growth region is greater than a growth rate in the vertical re-growth region.

30. The method for making a re-grown GaN crystal according to claim 29, further comprising slicing the re-grown GaN crystal to form a non-polar GaN substrate.

31. A method for making a re-grown GaN crystal, the method comprising:
providing a GaN seed crystal including a top surface and a plurality of crystalline edges of equivalent crystallographic direction adjoining the top surface, wherein the GaN seed crystal has a vertical dimension bounded by the top surface and the bottom surface, and a lateral dimension bounded by an opposing pair of the plurality of crystalline edges and orthogonal to the vertical dimension; and
growing a vertical re-growth region from the top surface and a lateral re-growth region from each of the plurality of crystalline edges to form a re-grown GaN crystal, by growing GaN on the GaN seed crystal utilizing a vapor phase growth process, wherein a growth rate in the lateral re-growth regions is greater than a growth rate in the vertical re-growth region.

32. The method for making a re-grown GaN crystal according to claim 31, wherein the growth rate in each lateral re-growth region is approximately equal to the growth rate in the other lateral re-growth regions.

33. The method for making a re-grown GaN crystal according to claim 31, further comprising slicing the re-grown GaN crystal to form a non-polar GaN substrate.

* * * * *

UNITED STATES PATENT AND TRADEMARK OFFICE
CERTIFICATE OF CORRECTION

PATENT NO. : 7,727,874 B2  Page 1 of 2
APPLICATION NO. : 12/283533
DATED : June 1, 2010
INVENTOR(S) : Andrew D. Hanser et al.

It is certified that error appears in the above-identified patent and that said Letters Patent is hereby corrected as shown below:

At column 1, line 67, column 6, line 20, column 6, line 22, column 9, line 53, column 10, line 18, column 10, line 21, column 10, line 33, column 10, line 54, column 12, line 33, column 12, line 43, column 13, line 51, column 14, line 7, column 14, line 25, column 15, line 24, and column 15, line 66, replace "[1100]" with --[1100]--

At column 1, line 69, column 2, line 27, column 6, line 20, column 6, line 22, column 9, line 53, column 10, line 19, column 10, line 21, column 10, line 47, column 10, line 52, column 12, line 7, column 12, line 9, column 12, line 43, column 12, line 54, column 12, line 58, column 14, line 6, column 14, line 30, column 14, line 55, column 15, line 7, column 15, line 25, column 15, line 40, and column 15, line 65, replace "[1120]" with --[1120]--

At column 2, line 3, replace "[1101]" with --[1101]--

At column 2, line 4, replace "[1122]" with --[1122]--

At column 2, line 27, replace "(1102)" with --(1102)--

At column 2, line 28, column 4, line 36, column 9, line 13, column 11, line 12, and column 16, line 50, replace "(1120)" with --(1120)--

At column 4, line 36, column 9, line 13, column 11, line 12, column 14, line 9, column 16, line 14, replace "(1100)" with --(1100)--

At column 4, line 38, column 9, line 15, and column 15, line 41, replace "(1101)" with --(1101)--

At column 4, line 39, column 9, line 15, column 15, line 26, column 15, line 30, and column 15, line 31, replace "(1122)" with --(1122)--

At column 7, line 10, replace "<1120>" with --<1120>--

Signed and Sealed this

Thirty-first Day of August, 2010

David J. Kappos
*Director of the United States Patent and Trademark Office*

At column 7, line 11, and column 12, line 55, replace "<1100>" with --<1$\underline{1}$00>--

At column 7, line 19, and column 16, line 53, replace "{1120}" with --{11$\underline{2}$0}--

At column 7, line 23, column 16, line 6, column 16, line 7, column 16, line 15, column 16, line 23, column 16, line 24, and column 16, line 34, replace "{1122}" with --{11$\underline{2}$2}--

At column 12, line 60, and column 12, line 66, replace "[0001]" with --[000$\underline{1}$]--

At column 12, line 27, replace "r-plane" with --m-plane--

At column 13, line 47, replace "107 -scan" with --ω-scan--

At column 14, line 57, replace "=0.25°" with --±0.25°--

At column 16, line 51, replace "{1101}" with --{1$\underline{1}$01}--

At column 16, line 52, replace "{1100}" with --{1$\underline{1}$00}--

At claim 3, line 25, claim 5, line 32, claim 22, line 57, and claim 24, line 64, replace "(1120)" with --(11$\underline{2}$0)--

At claim 2, line 22, claim 4, line 28, claim 21, line 54, and claim 23, line 61, replace "(1100)" with --(1$\underline{1}$00)--

At claim 5, line 33, and claim 22, line 58, replace "(1101)" with --(1$\underline{1}$01)--

At claim 4, line 29, and claim 21, line 55, replace "(1122)" with --(11$\underline{2}$2)--

At claim 5, line 33, replace "(1103)" with --(1$\underline{1}$03)--

UNITED STATES PATENT AND TRADEMARK OFFICE
CERTIFICATE OF CORRECTION

PATENT NO. : 7,727,874 B2
APPLICATION NO. : 12/283533
DATED : June 1, 2010
INVENTOR(S) : Andrew D. Hanser et al.

It is certified that error appears in the above-identified patent and that said Letters Patent is hereby corrected as shown below:

At column 1, line 67, column 6, line 20, column 6, line 22, column 9, line 53, column 10, line 18, column 10, line 21, column 10, line 33, column 10, line 54, column 12, line 33, column 12, line 43, column 13, line 51, column 14, line 7, column 14, line 25, column 15, line 24, and column 15, line 66, replace "[1100]" with --[1_100]--

At column 1, line 69, column 2, line 27, column 6, line 20, column 6, line 22, column 9, line 53, column 10, line 19, column 10, line 21, column 10, line 47, column 10, line 52, column 12, line 7, column 12, line 9, column 12, line 43, column 12, line 54, column 12, line 58, column 14, line 6, column 14, line 30, column 14, line 55, column 15, line 7, column 15, line 25, column 15, line 40, and column 15, line 65, replace "[1120]" with --[112_0]--

At column 2, line 3, replace "[1101]" with --[1_101]--

At column 2, line 4, replace "[1122]" with --[112_2]--

At column 2, line 27, replace "(1102)" with --(1_102)--

At column 2, line 28, column 4, line 36, column 9, line 13, column 11, line 12, and column 16, line 50, replace "(1120)" with --(112_0)--

At column 4, line 36, column 9, line 13, column 11, line 12, column 14, line 9, column 16, line 14, replace "(1100)" with --(1_100)--

At column 4, line 38, column 9, line 15, and column 15, line 41, replace "(1101)" with --(1_101)--

At column 4, line 39, column 9, line 15, column 15, line 26, column 15, line 30, and column 15, line 31, replace "(1122)" with --(112_2)--

This certificate supersedes the Certificate of Correction issued August 31, 2010.

Signed and Sealed this

Twenty-eighth Day of September, 2010

David J. Kappos
*Director of the United States Patent and Trademark Office*

CERTIFICATE OF CORRECTION (continued)
U.S. Pat. No. 7,727,874 B2

At column 7, line 10, replace "<1120>" with --<11$\underline{2}$0>--

At column 7, line 11, and column 12, line 55, replace "<1100>" with --<1$\underline{1}$00>--

At column 7, line 19, and column 16, line 53, replace "{1120}" with --{11$\underline{2}$0}--

At column 7, line 23, column 16, line 6, column 16, line 7, column 16, line 15, column 16, line 23, column 16, line 24, and column 16, line 34, replace "{1122}" with --{11$\underline{2}$2}--

At column 12, line 60, and column 12, line 66, replace "[0001]" with --[000$\underline{1}$]--

At column 12, line 27, replace "r-plane" with --m-plane--

At column 13, line 47, replace "107 -scan" with --ω-scan--

At column 14, line 57, replace "=0.25°" with --±0.25°--

At column 16, line 51, replace "{1101}" with --{1$\underline{1}$01}--

At column 16, line 52, replace "{1100}" with --{1$\underline{1}$00}--

At claim 3, column 18, line 25, claim 5, column 18, line 32, claim 22, column 19, line 57, and claim 24, column 19, line 64, replace "(1120)" with --(11$\underline{2}$0)--

At claim 2, column 18, line 22, claim 4, column 18, line 28, claim 21, column 19, line 54, and claim 23, column 19, line 61, replace "(1100)" with --(1$\underline{1}$00)--

At claim 5, column 18, line 33, and claim 22, column 19, line 58, replace "(1101)" with --(1$\underline{1}$01)--

At claim 4, column 18, line 29, and claim 21, column 19, line 55, replace "(1122)" with --(11$\underline{2}$2)--

At claim 5, column 18, line 33, replace "(1103)" with --(1$\underline{1}$03)--